(12) United States Patent
Lu et al.

(10) Patent No.: US 10,529,618 B2
(45) Date of Patent: Jan. 7, 2020

(54) METHODS OF MANUFACTURING A SEMICONDUCTOR DEVICE

(71) Applicant: Samsung Electronics Co., Ltd., Suwon-si (KR)

(72) Inventors: Siqing Lu, Seongnam-si (KR); Sang-Hoon Ahn, Goyang-si (KR); Xinglong Chen, Seongnam-si (KR); Ki-Hyun Kim, Yongin-si (KR); Kyu-In Shim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 29 days.

(21) Appl. No.: 15/870,175

(22) Filed: Jan. 12, 2018

(65) Prior Publication Data

US 2018/0358262 A1 Dec. 13, 2018

(30) Foreign Application Priority Data

Jun. 8, 2017 (KR) ........................ 10-2017-0071389

(51) Int. Cl.
*H01L 21/76* (2006.01)
*H01L 21/768* (2006.01)
*H01L 23/528* (2006.01)
*H01L 21/02* (2006.01)
*H01L 21/311* (2006.01)
*H01L 23/522* (2006.01)
(Continued)

(52) U.S. Cl.
CPC .... *H01L 21/76807* (2013.01); *H01L 21/0228* (2013.01); *H01L 21/0274* (2013.01); *H01L 21/02208* (2013.01); *H01L 21/31111* (2013.01); *H01L 21/31144* (2013.01); *H01L 21/7684* (2013.01); *H01L 21/76877* (2013.01); *H01L 23/5226* (2013.01); *H01L 23/5283* (2013.01); *H01L 21/3212* (2013.01); *H01L 21/76843* (2013.01)

(58) Field of Classification Search
CPC ........... H01L 21/76807; H01L 23/5226; H01L 21/02208; H01L 21/76877; H01L 21/0228; H01L 21/76843; H01L 21/0274
See application file for complete search history.

(56) References Cited

U.S. PATENT DOCUMENTS

| 6,946,401 | B2 | 9/2005 | Huang et al. |
| 7,749,871 | B2 | 7/2010 | Elers et al. |
| 9,275,898 | B1 | 3/2016 | Shu et al. |

(Continued)

FOREIGN PATENT DOCUMENTS

| KR | 1013818 | 2/2011 |
| KR | 1090391 | 11/2011 |
| KR | 1491726 | 2/2015 |

*Primary Examiner* — Charles D Garber
*Assistant Examiner* — S M Sohel Imtiaz
(74) *Attorney, Agent, or Firm* — Muir Patent Law, PLLC

(57) ABSTRACT

A method of manufacturing a semiconductor device is disclosed. The method includes forming a first insulting layer on a substrate, forming a first conductor pattern in the first insulating layer, forming a second insulating layer on the first insulating layer, and forming a second wiring pattern and a contact via in the second insulating layer, wherein a top surface of the first insulating layer is higher than a top surface of the first conductor pattern.

17 Claims, 23 Drawing Sheets

(51) Int. Cl.
*H01L 21/027* (2006.01)
*H01L 21/321* (2006.01)

(56) References Cited

U.S. PATENT DOCUMENTS

| | | | |
|---|---|---|---|
| 9,418,889 B2 | 8/2016 | Mountsier et al. | |
| 2008/0119057 A1* | 5/2008 | Chua | H01L 21/28185 |
| | | | 438/763 |
| 2010/0078825 A1* | 4/2010 | Patz | H01L 21/67253 |
| | | | 257/774 |
| 2014/0252633 A1* | 9/2014 | Tsai | H01L 21/76802 |
| | | | 257/773 |
| 2015/0031218 A1 | 1/2015 | Karakawa | |
| 2015/0235896 A1* | 8/2015 | Mieth | H01L 21/76807 |
| | | | 438/637 |
| 2015/0299848 A1 | 10/2015 | Haukka et al. | |
| 2016/0322213 A1 | 11/2016 | Thompson et al. | |
| 2017/0092533 A1 | 3/2017 | Chakraborty et al. | |
| 2017/0110313 A1* | 4/2017 | Tang | C23C 16/401 |
| 2017/0110397 A1* | 4/2017 | Wu | H01L 21/02126 |
| 2017/0125340 A1* | 5/2017 | Tsai | H01L 21/02071 |

* cited by examiner

FIG. 4
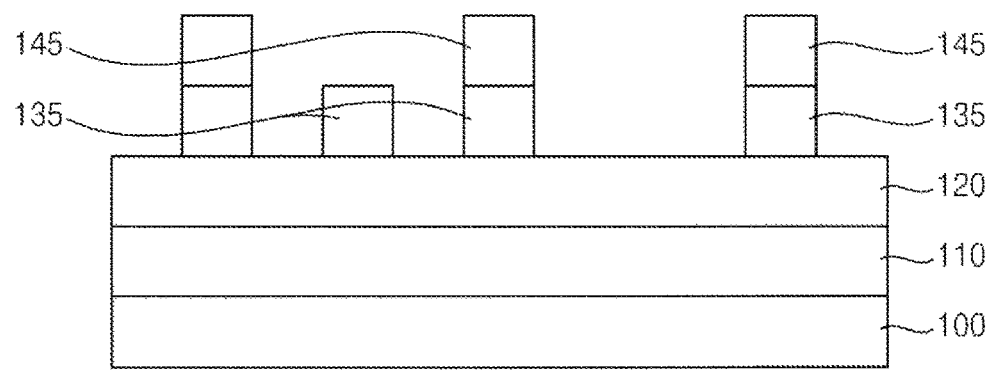
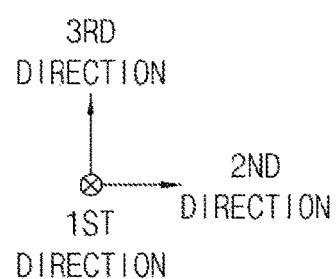
FIG. 5
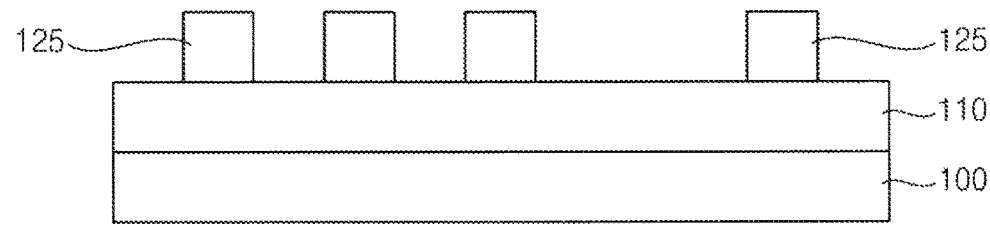
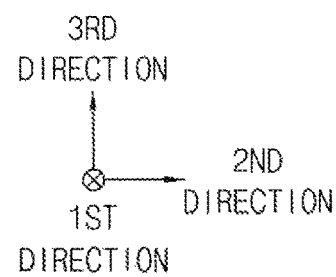

FIG. 6
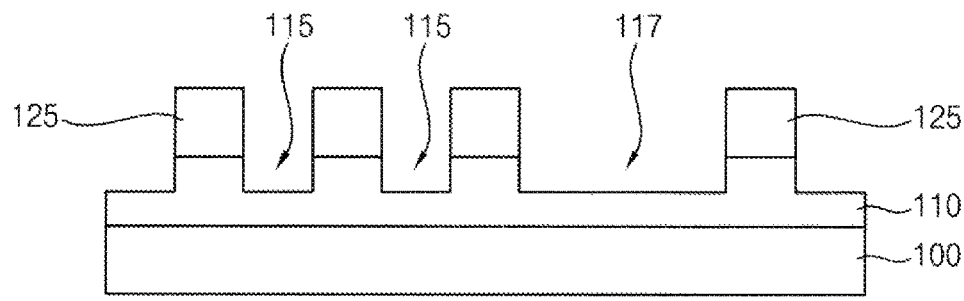
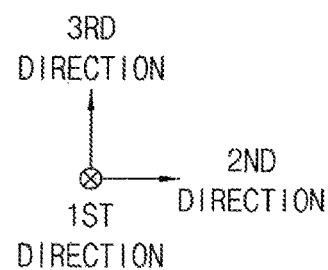
FIG. 7
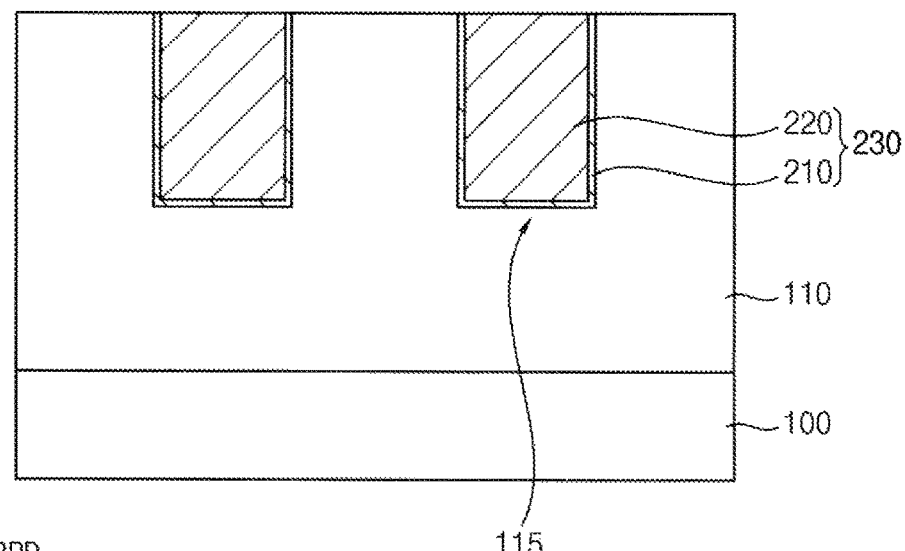
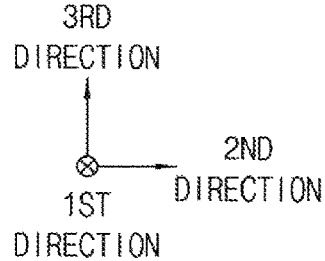

FIG. 12A
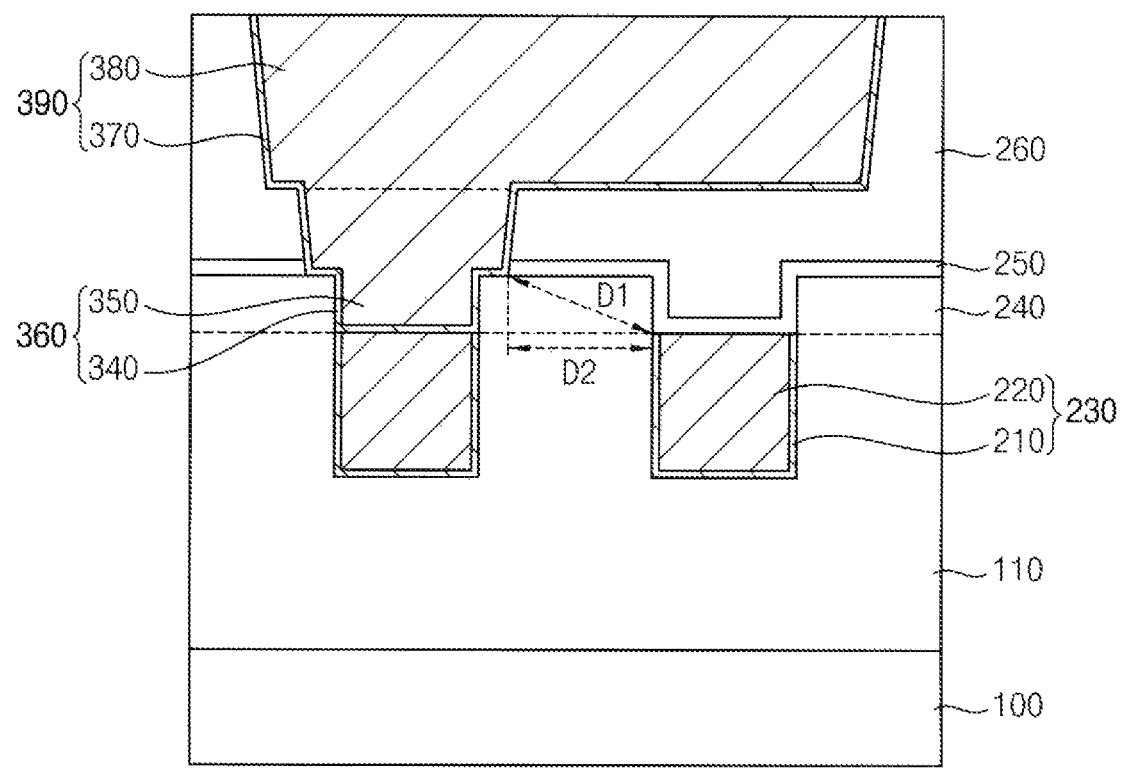
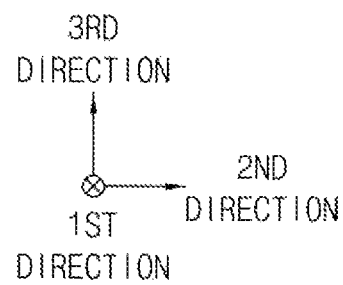

FIG. 15
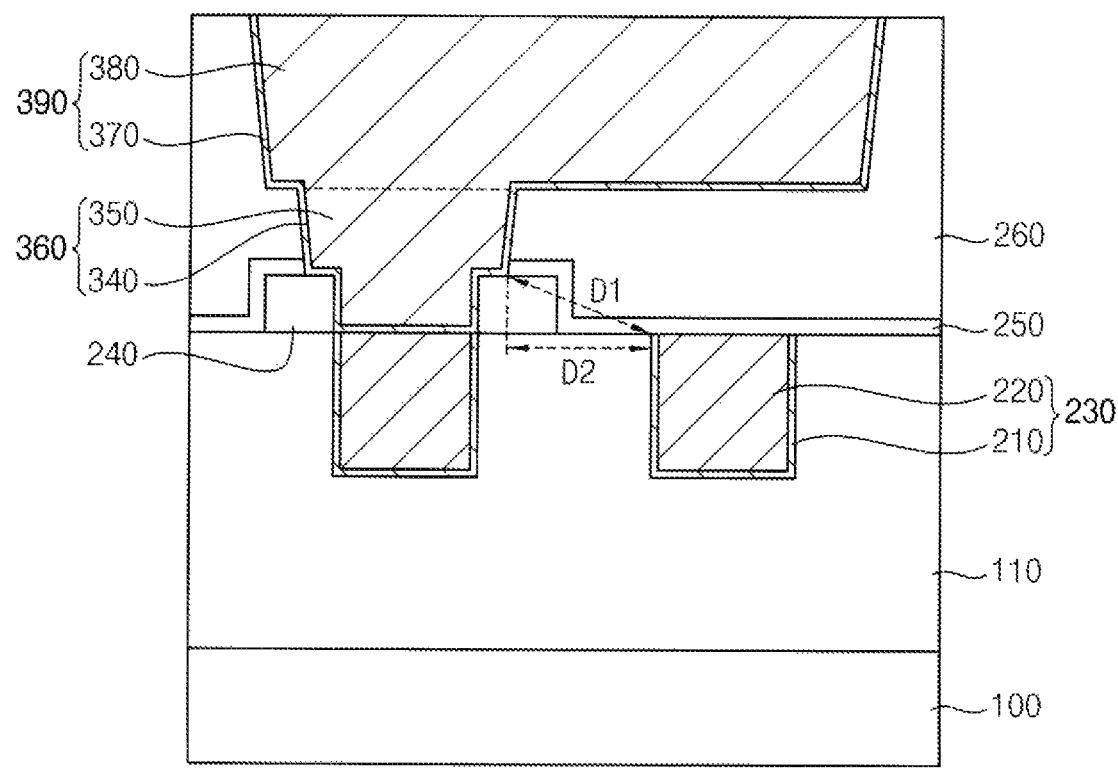
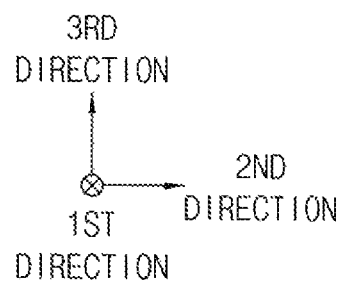

FIG. 16
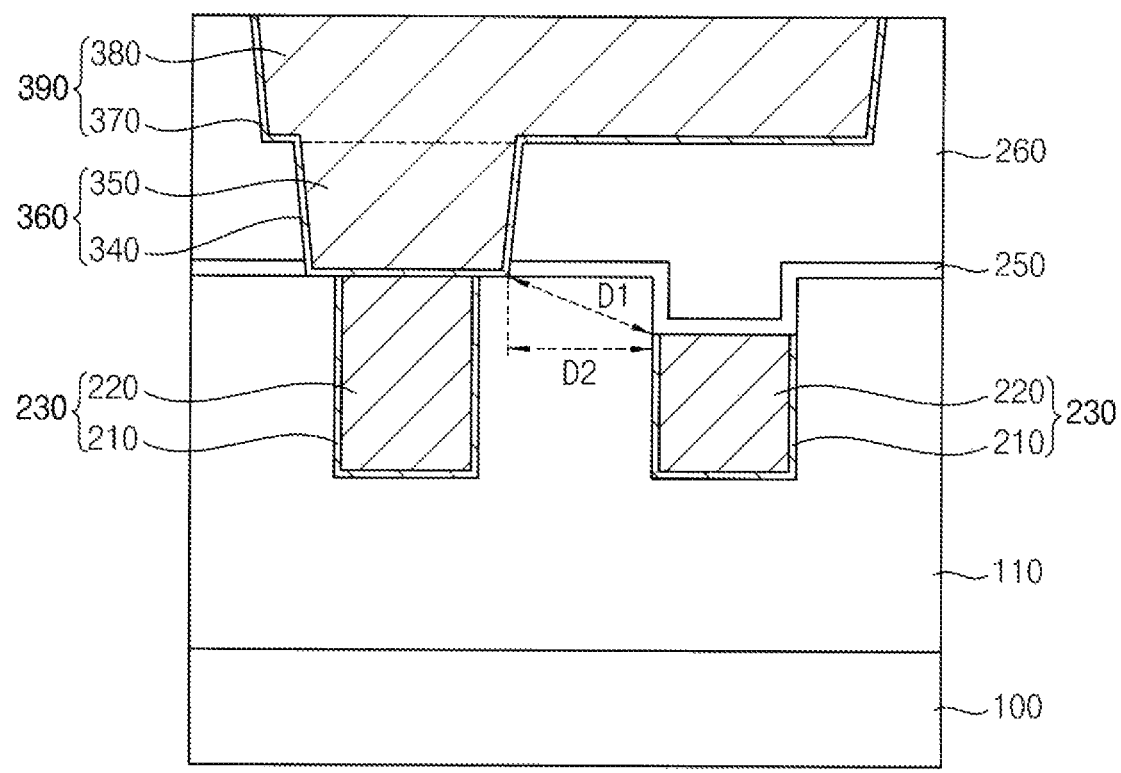
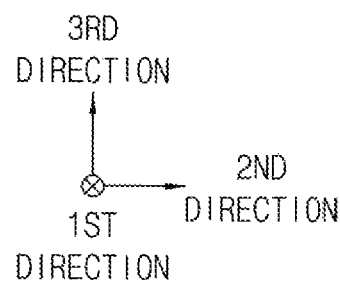

US 10,529,618 B2

METHODS OF MANUFACTURING A SEMICONDUCTOR DEVICE

CROSS-REFERENCE TO RELATED APPLICATION

This application claims priority under 35 USC § 119 to Korean Patent Application No. 10-2017-0071389, filed on Jun. 8, 2017 in the Korean Intellectual Property Office (KIPO), the contents of which are herein incorporated by reference in their entirety.

BACKGROUND

1. Field

Example embodiments relate to methods of manufacturing a semiconductor device. More particularly, example embodiments relate to methods of manufacturing a semiconductor device including wirings and vias.

2. Description of the Related Art

A via may contact an upper surface of a specific one of underlying wirings. As the wirings are formed to be spaced apart from each other by a minute distance, an electrical short may occur between the via and other ones of the underlying wirings.

SUMMARY

Example embodiments provide a method of manufacturing a semiconductor device including vias and wirings having good characteristics.

According to example embodiments, there is provided a method of manufacturing a semiconductor device. In the method, a first insulating interlayer containing lower wirings of which upper surfaces are exposed may be formed on a substrate. A second insulating interlayer may be selectively formed on an exposed upper surface of the first insulating interlayer. A first etch stop layer and a third insulating interlayer may be sequentially formed on the lower wirings and the second insulating interlayer. A trench and first and second via holes may be formed. The trench may extend through an upper portion of the third insulating interlayer, the first via hole may extend through a lower portion of the third insulating interlayer and a portion of the first etch stop layer to be connected to the trench, and the second via hole may extend through the second insulating interlayer to expose a first wiring of the lower wirings and to be connected to the first via hole. The second via hole may have a width smaller than that of the first via hole. An upper wiring filling the trench and a via filling the first and second via holes may be formed.

According to example embodiments, there is provided a method of manufacturing a semiconductor device. In the method, a first insulating interlayer containing lower wirings of which upper surfaces are exposed may be formed on a substrate. Upper portions of the lower wirings may be removed. A first etch stop layer and a second insulating interlayer may be sequentially formed on the lower wirings and the first insulating interlayer. A trench and first and second via holes may be formed. The trench may extend through an upper portion of the second insulating interlayer, the first via hole may extend through a lower portion of the second insulating interlayer and a portion of the first etch stop layer to be connected to the trench, and the second via hole may extend through an upper portion of the first insulating interlayer to expose a first wiring of the lower wirings and to be connected to the first via hole. An upper wiring filling the trench and a via filling the first and second via holes may be formed.

According to example embodiments, there is provided a method of manufacturing a semiconductor device. In the method, a first insulating interlayer containing first and second lower wirings of which upper surfaces are exposed may be formed on a substrate. An upper portion of the second lower wiring may be removed. An etch stop layer and a second insulating interlayer may be sequentially formed on the first and second lower wirings and the first insulating interlayer. A trench and a via hole may be formed. The trench may extend through an upper portion of the second insulating interlayer, and the via hole may extend through a lower portion of the second insulating interlayer and a portion of the etch stop layer to be connected to the trench and to expose an upper surface of the first lower wiring. An upper wiring filling the trench and a via filling the via hole may be formed.

In the method of manufacturing the semiconductor device in example embodiments, the second insulating interlayer may be selectively formed on the first insulating interlayer containing the lower wirings, and the etch stop layer and the third insulating interlayer may be formed on the second insulating interlayer and the lower wirings. Thus, the via filling the via hole formed by etching the third insulating interlayer may have a width that may not be greater than that of an upper surface of the first wiring of the lower wirings contacting the via, and may have a width greater than that of the first wiring only at a level higher than the upper surface of the first wiring. Accordingly, the distance between the via and the neighboring one of the lower wirings may increase, and thus the electrical short margin may increase.

According to exemplary embodiments, a method of manufacturing a semiconductor device includes steps of forming a first insulating layer on a substrate, forming a first conductor pattern and a second conductor pattern in the first insulating layer, a top surface of the first insulating layer protruding above a top surface of the first and second conductor patterns, the first and second conductor patterns extending to a first direction, forming a second insulating layer on the first insulating layer and on the first and second conductor patterns, forming a third conductor pattern on the second insulating layer, the third conductor pattern extending to a second direction crossing the first direction, and forming a first via electrically connecting the first conductor pattern and the third conductor pattern, the first via contacting the first conductor pattern and a portion of the top surface of the first insulating layer adjacent to the first conductor pattern, wherein a boundary between the first via and the first conductor pattern is lower than a boundary between the first via and the portion of the top surface of the first insulating layer.

BRIEF DESCRIPTION OF THE DRAWINGS

Example embodiments will be more clearly understood from the following detailed description taken in conjunction with the accompanying drawings. FIGS. 1 to 25 represent non-limiting, example embodiments as described herein.

FIGS. 1 to 11, 12A, and 12B are cross-sectional views illustrating stages of a method of manufacturing a semiconductor device in accordance with example embodiments, FIG. 13 is a flowchart illustrating an atomic layer deposition (ALD) process used in the method of manufacturing the semiconductor device, and FIG. 14 is a cross-sectional view illustrating a chamber used in the ALD process;

FIGS. 15 and 16 are cross-sectional views illustrating stages of a method of manufacturing a semiconductor device in accordance with example embodiments; and FIGS. 17 to 25 are perspective views illustrating stages of a method of manufacturing a semiconductor device in accordance with example embodiments.

DETAILED DESCRIPTION

Figure 12B:
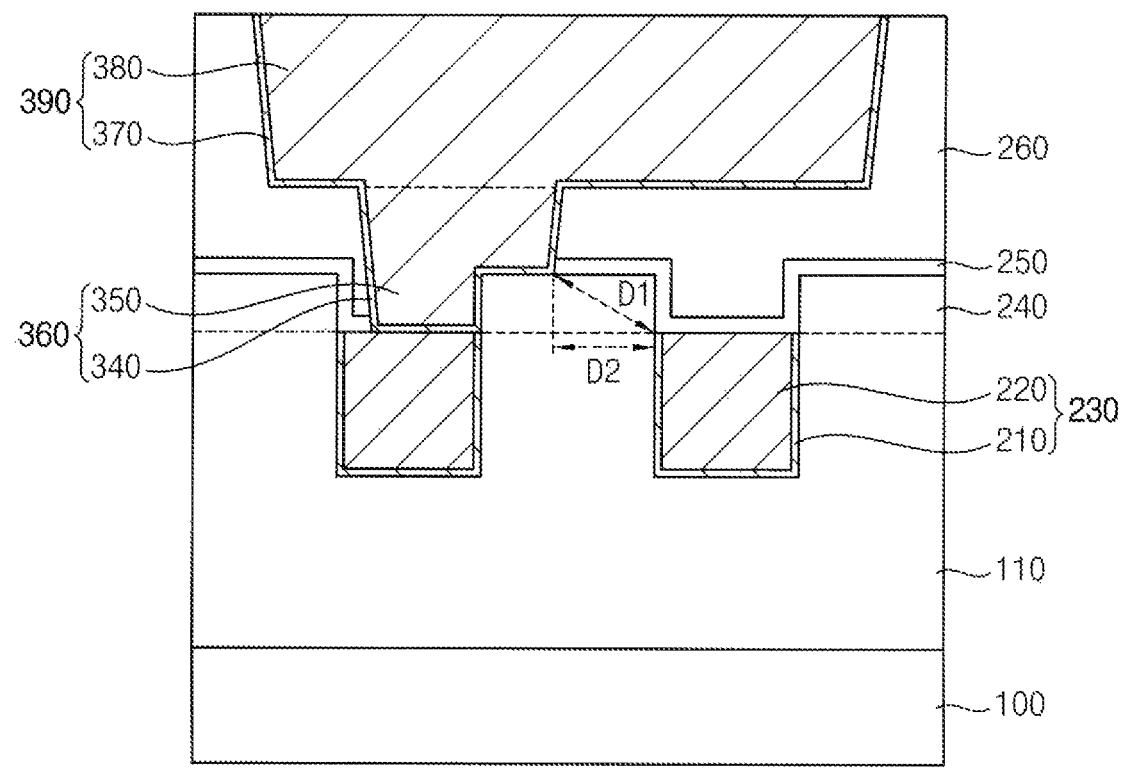
Figure 13:
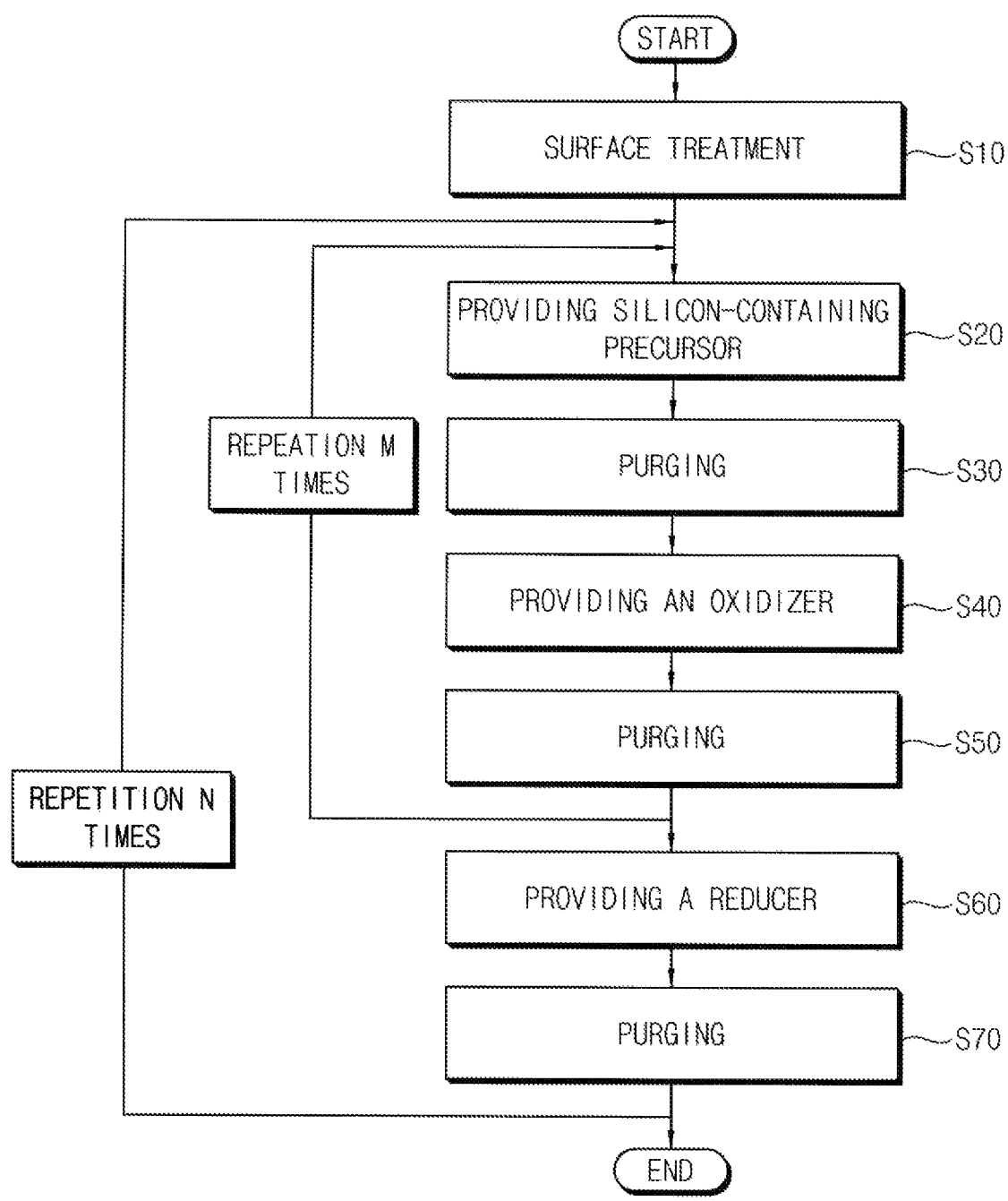
Figure 14:
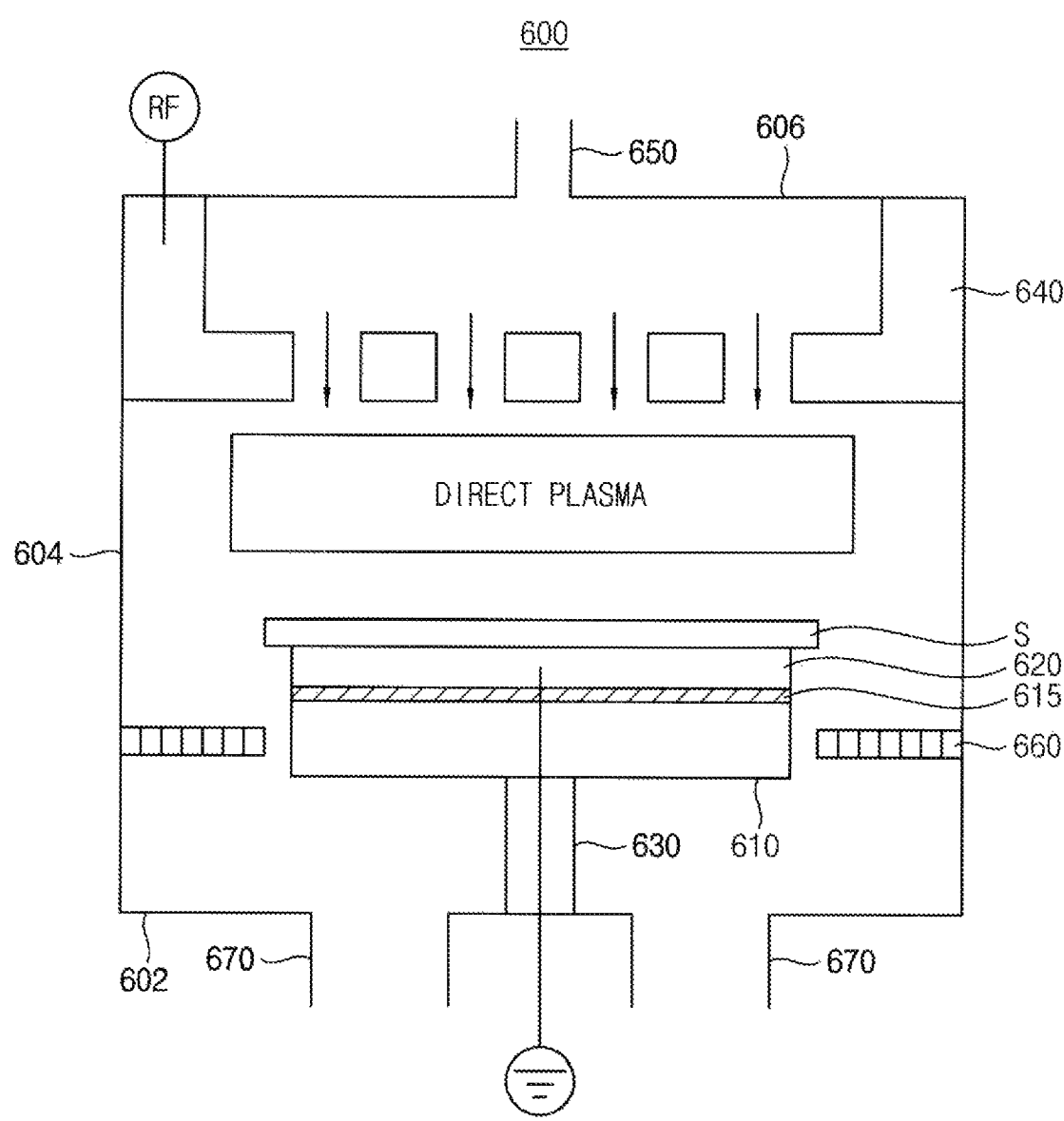

FIGS. 1 to 11, 12A, and 12B are cross-sectional views illustrating stages of a method of manufacturing a semiconductor device in accordance with example embodiments, FIG. 13 is a flowchart illustrating an atomic layer deposition (ALD) process used in the method of manufacturing the semiconductor device, and FIG. 14 is a cross-sectional view illustrating a chamber used in the ALD process.

Figure 1:
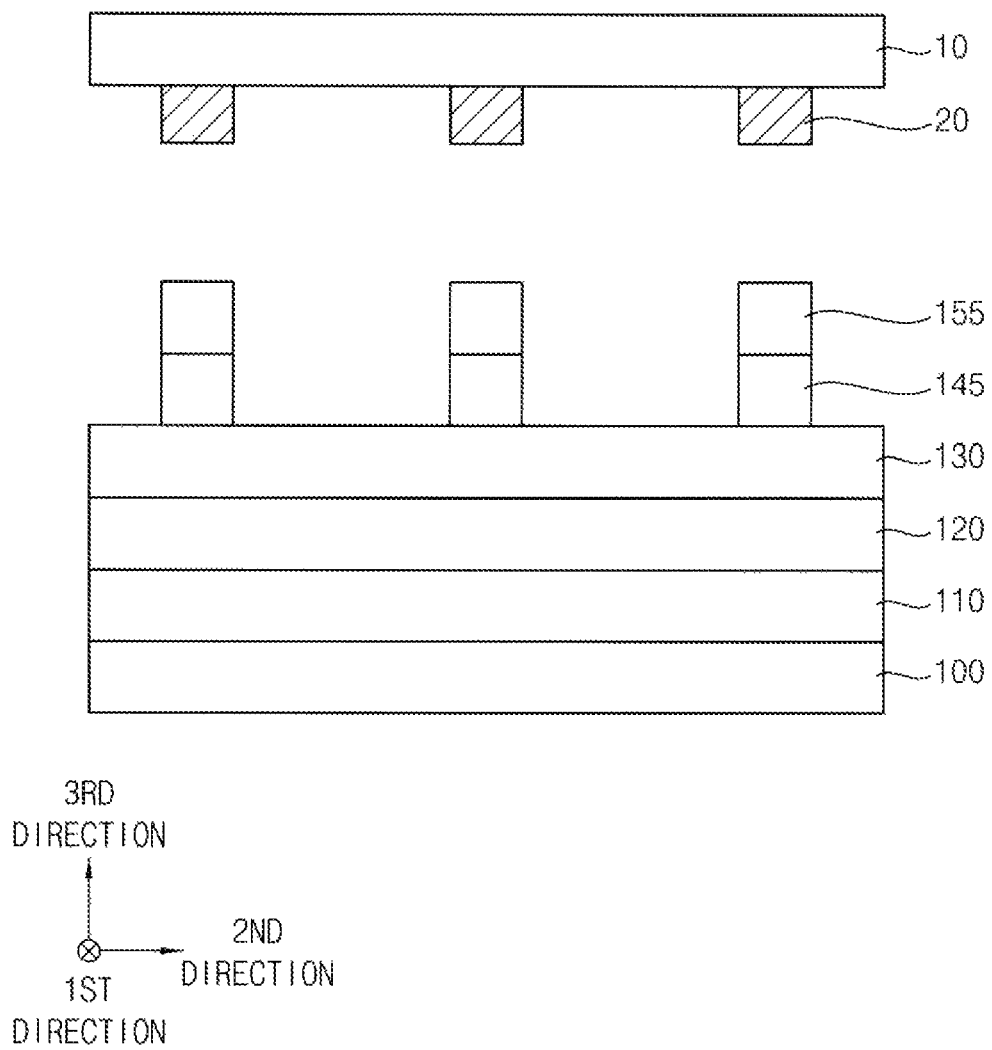

Referring to FIG. 1, a first insulating interlayer 110, first and second layers 120 and 130, a third layer, and a first photoresist layer may be sequentially formed on an upper surface of a substrate 100 in a third direction substantially perpendicular to the upper surface of the substrate 100, the first photoresist layer may be patterned to form a first photoresist pattern 155, and the third layer may be patterned using the first photoresist pattern 155 as an etching mask to form a third pattern 145.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

Various types of elements (not shown), e.g., gate structures, source/drain layers, contact plugs, wirings, vias, etc., may be further formed on the substrate 100, and may be covered by an insulation layer (not shown).

In example embodiments, the first insulating interlayer 110 may include a low-k dielectric material. For example, the first insulating interlayer 110 may include silicon oxide doped with carbon (SiCOH), silicon oxide doped with fluorine (F—$SiO_2$), a porous silicon oxide, spin-on organic polymer, or an inorganic polymer, e.g., hydrogen silsesquioxane (HSSQ), methyl silsesquioxane (MSSQ), etc.

The first layer 120 may include, e.g., amorphous carbon layer (ACL), the second layer 130 may include an oxynitride, e.g., plasma enhanced silicon oxynitride (PE-SION), and the third layer may include, e.g., spin-on-hardmask (SOH). However, the materials of the first and second layers 120 and 130 and the third layer may not be limited thereto, and various types of materials having etching selectivity with each other may be used.

In example embodiments, the first photoresist pattern 155 may be formed by a first photolithography process in which the first photoresist layer may be patterned using a first reticle 10 having a first light shield pattern 20 thereunder.

In an example embodiment, each of the first photoresist pattern 155 and the third pattern 145 may extend to a given length in a first direction substantially parallel to the upper surface of the substrate 100, and a plurality of first photoresist patterns 155 may be formed to be spaced apart from each other by a distance in a second direction substantially parallel to the upper surface of the substrate 100 and substantially perpendicular to the first direction, and a plurality of third patterns 145 may be also formed to be spaced apart from each other by the distance in the second direction.

Figure 2:
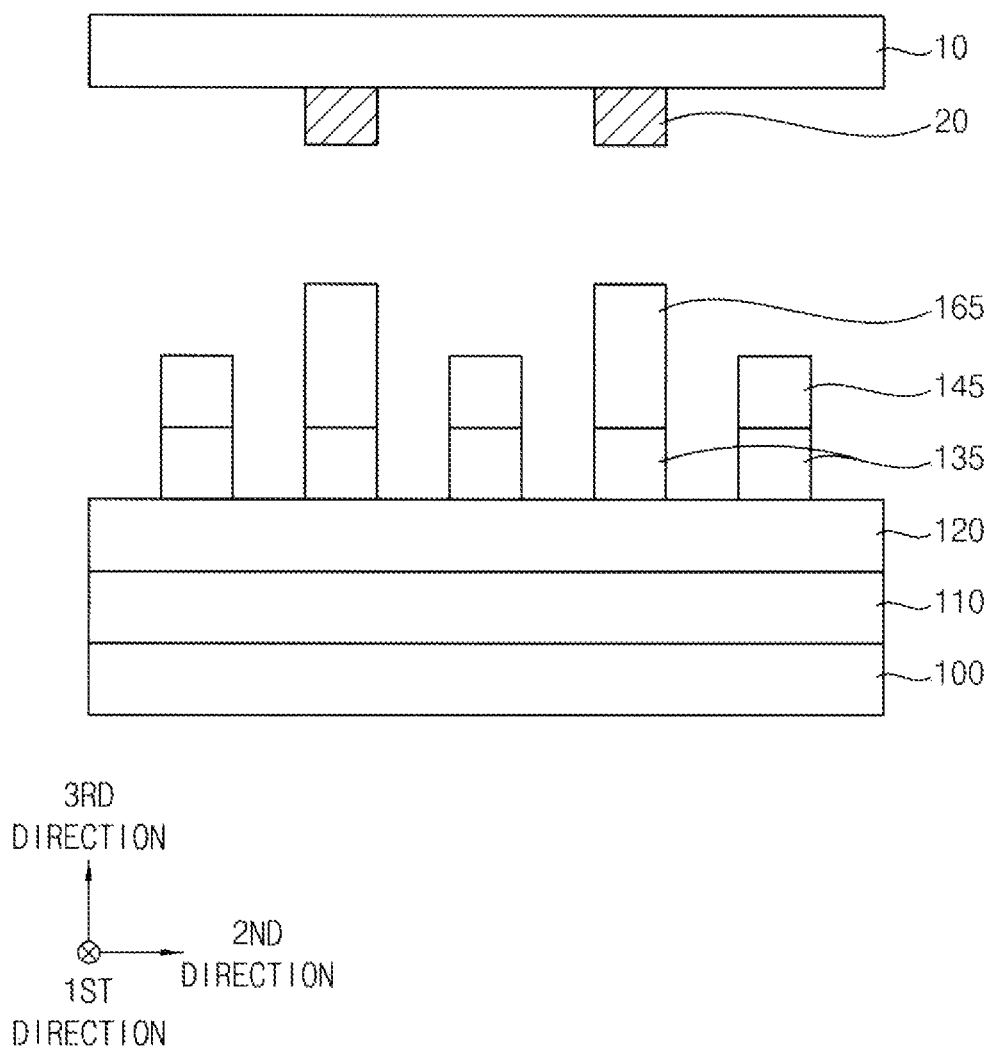

Referring to FIG. 2, after removing the first photoresist pattern 155, a second photoresist layer may be formed on the second layer 130 to cover the third pattern 145, and may be patterned to form a second photoresist pattern 165. The second layer 130 may be patterned using the second photoresist pattern 165 and the third pattern 145 as an etching mask to form a second pattern 135.

In example embodiments, the first photoresist pattern 155 may be removed by an ashing process and/or a stripping process.

In example embodiments, the second photoresist pattern 165 may be formed by a second photolithography process in which the second photoresist layer may be patterned using the first reticle 10 having the first light shield pattern 20 thereunder. The second photolithography process may be performed, for example, after moving the first reticle 10 used in the first photolithography process to a given distance to the second direction. Thus, the second photolithography process may be performed using the first reticle 10 without making a new reticle.

In an example embodiment, each of the second photoresist pattern 165 and the second pattern 135 may extend to a given length in the first direction, and a plurality of second photoresist patterns 165 may be formed to be spaced apart from each other by a distance in the second direction, and a plurality of second patterns 135 may be also formed to be spaced apart from each other by a distance in the second direction.

By the first and second photolithography processes, the second patterns 135 having a minute width may be formed to be spaced apart from each other by a minute distance in the second direction. As described above, the second patterns 135 may be formed by moving the first reticle 10 having the first light shield pattern 20 thereunder to the second direction, and thus if the movement is not exactly performed, the distances between the second patterns 135 may not be uniform.

Figure 3:
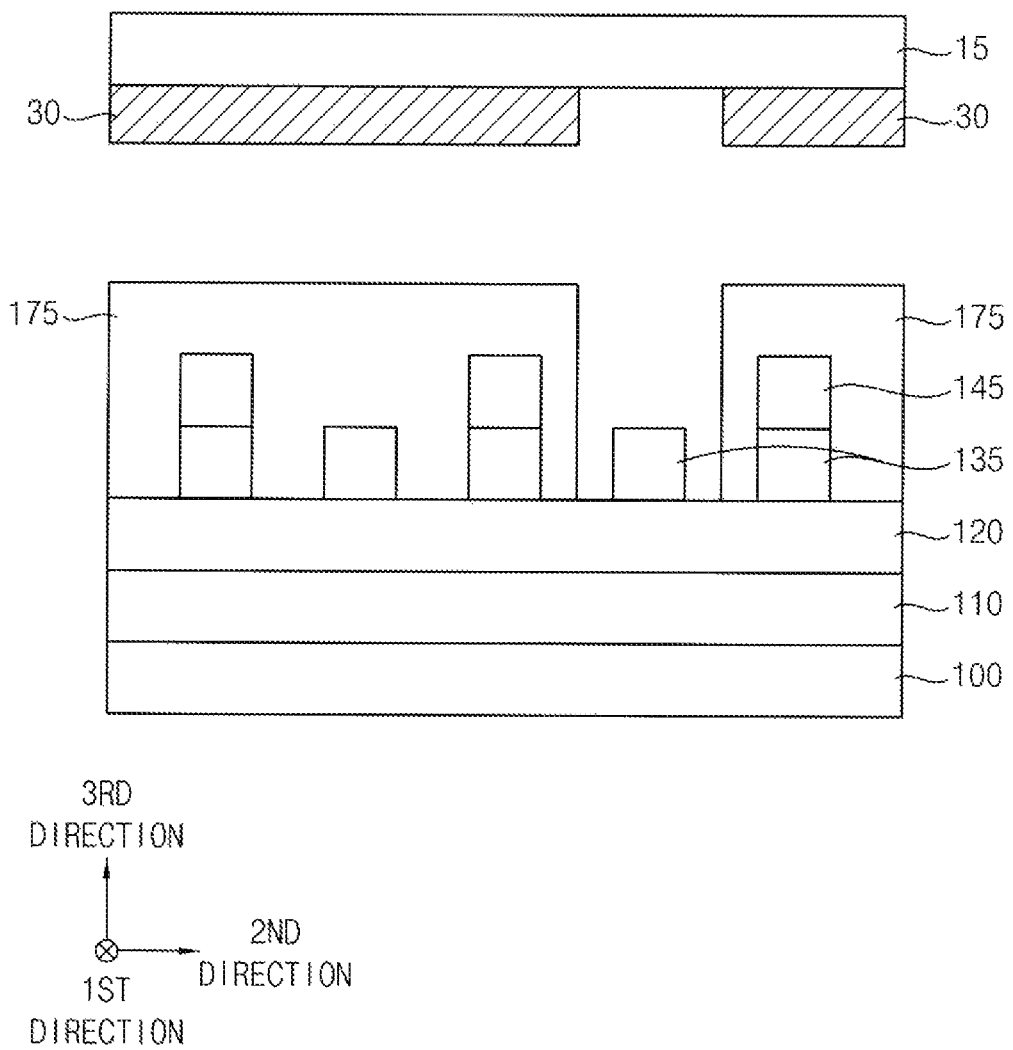

Referring to FIG. 3, after removing the second photoresist pattern 165, a third photoresist layer may be formed on the first layer 120 to cover the second and third patterns 135 and 145, and may be patterned to form a third photoresist pattern 175.

In example embodiments, the third photoresist pattern 175 may be formed by a third photolithography process in which the third photoresist layer may be patterned using a second reticle 15 having a second light shield pattern 30 thereunder.

Referring to FIG. 4, portions of the second patterns 135 not covered by the third photoresist pattern 175 may be removed using the third photoresist pattern 175 as an etching mask. In certain embodiments, a portion of the third patterns 145 not covered by the third photoresist pattern 175 (not shown) may be removed using the third photoresist pattern 175 as an etch mask.

Referring to FIG. 5, the first layer 120 may be etched using the second and third patterns 135 and 145 as an etching mask to form a first pattern 125.

In an example embodiment, the first pattern 125 may extend to a given length in the first direction, and a plurality of first patterns 125 may be formed in the second direction.

Some or all of the second and third patterns 135 and 145 may be removed in the etching process.

Referring to FIG. 6, an upper portion of the first insulating interlayer 110 may be etched using the first pattern 125 as an etching mask to form first and second recesses 115 and 117.

In an example embodiment, the first recess 115 may extend to a given length in the first direction, and have a first width in the second direction. The second recess 117 may extend to a given length in the first direction, and may have a second width greater than the first width in the second direction.

FIGS. 7 through 12B illustrate a region in which the first recesses 115 are formed.

Referring to FIG. 7, a first barrier layer may be formed on an inner wall of the first recess 115 and an upper surface of the first insulating interlayer 110, a first conductive layer may be formed on the first barrier layer to fill the first recess 115, and the first conductive layer and the first barrier layer may be planarized until the upper surface of the first insulating interlayer 110 may be exposed.

Thus, a first barrier pattern 210 may be formed on the inner wall of the first recess 115, and a first conductive pattern 220 may be formed on the first barrier pattern 210 to fill a remaining portion of the first recess 115. The first barrier pattern 210 and the first conductive pattern 220 may form a lower wiring 230.

In example embodiments, the planarization process may be performed by a chemical mechanical polishing (CMP) process and/or an etch back process.

The first barrier layer may include a metal nitride, e.g., titanium nitride, tantalum nitride, tungsten nitride, etc., and the first conductive layer may include a metal, e.g., copper, aluminum, tungsten, etc.

In an example embodiment, the lower wiring 230 may extend to a given length in the first direction, and a plurality of lower wirings 230 may be formed to be spaced apart from each other in the second direction.

Figure 8:
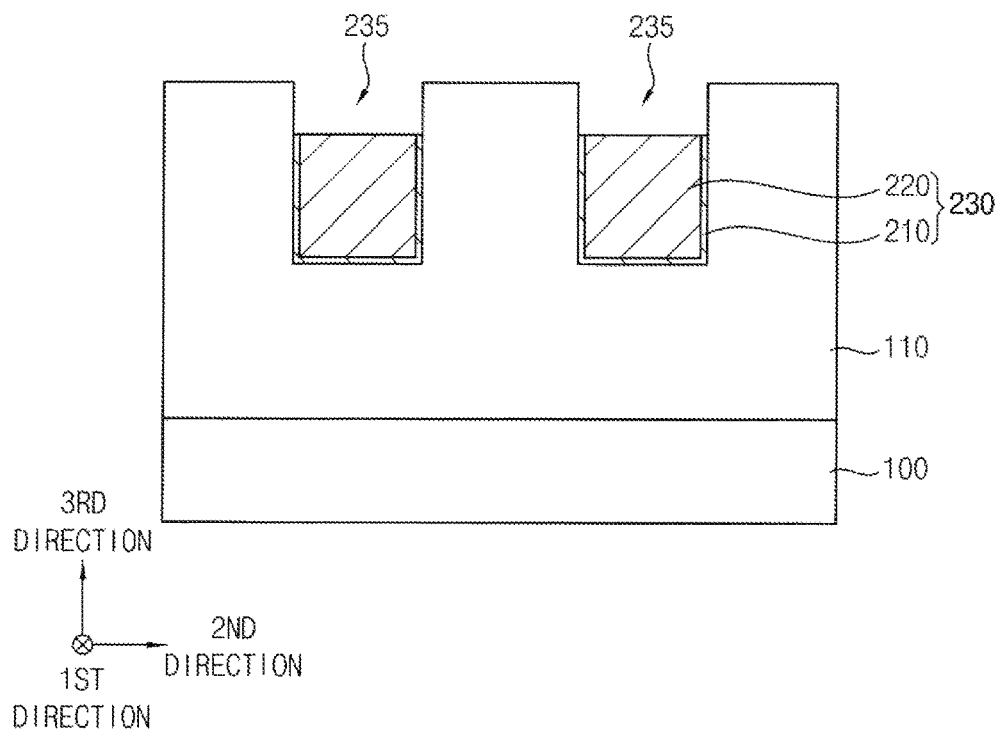

Referring to FIG. 8, an upper portion of each of the lower wirings 230 may be removed to form a third recess 235.

In example embodiments, the upper portion of each of the lower wirings 230 may be removed by an etch back process or an etching process using a photoresist pattern (not shown). For example, in etching the structure of FIG. 7, an etch back process may be performed in which the lower wirings 230 (e.g., the first conductive layer of the lower wirings 230) has an etch selectivity with respect to the upper surface of the first insulating layer 110 so that the lower wirings 230 (e.g., the first conductive layer of the lower wirings 230) may be etched at a higher rate than that of the first insulating layer 110.

Since the third recess 235 is formed, an upper surface of each of the lower wirings 230 may be lower than the upper surface of the first insulating interlayer 110.

Figure 9:
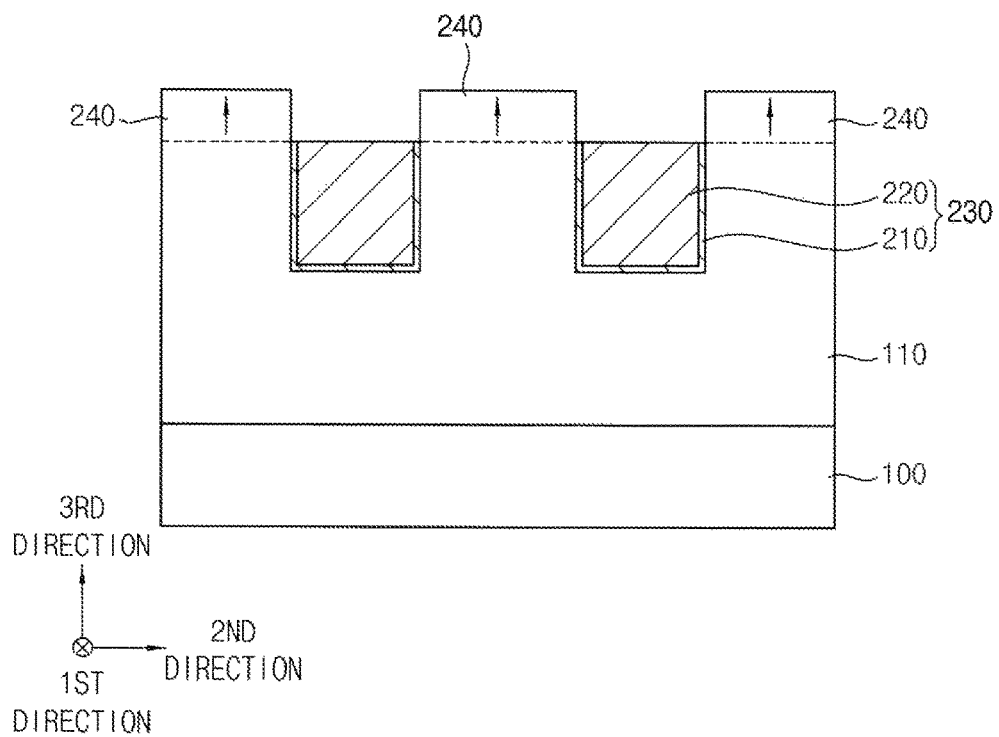

Alternatively, referring to FIG. 9, a second insulating interlayer 240 may be selectively grown, such as grown only on the exposed upper surface of the first insulating interlayer 110, and thus the second insulating interlayer 240 having an upper surface higher than upper surfaces of the lower wirings 230 may be formed.

In the processes described with reference to FIGS. 8 and 9, the first insulating interlayer 110 or the second insulating interlayer 240 adjacent to the lower wirings 230 may be formed to have an upper surface higher than the upper surfaces of the lower wirings 230. Hereinafter, the process for selectively growing the second insulating interlayer 240 only on the exposed upper surface of the first insulating interlayer 110 will be described.

In example embodiments, the selective growth process of the second insulating interlayer 240 may be performed by an ALD process, such as described with reference to FIGS. 13 and 14. In certain embodiments, the first insulating interlayer 110 and the second insulating layer 240 may be collectively referenced as an insulating layer or an insulator (i.e., in the singular form), and the first and second insulating interlayers 110 and 240 may be individually referenced as sub-insulating layers (e.g., a first sub-insulating layer and a second sub-insulating layer) of the insulating layer. Similar expressions may also be applied to similar structures of some other embodiments described below.

Referring to FIG. 14, a chamber 600 may include a lower wall 602, a sidewall 604, and an upper wall 606. The chamber 600 may include a heater 610, a susceptor 620, a support 630, a shower head 640, and a baffle 660 disposed in an inner space defined by the lower wall 602, the sidewall 604, and the upper wall 606, and may further include an inlet 650 connected to the upper wall 606, and an outlet 670 connected to the lower wall 602.

The heater 610 may move upward and downward by the support 630. The heater 610 may heat the susceptor 620 through a mesh 615 thereon, and thus heat may be provided for a substrate S loaded onto the susceptor 620.

Various source gases, reaction gases, purge gases, etc., may be provided into the chamber 600 via the inlet 650, and may be provided onto the substrate S via the shower head 640.

In an example embodiment, RF power source may be applied to the shower head 640 and the susceptor 620 may be grounded, so that RF power may be applied between the shower head 640 and the susceptor 620 and direct plasma may be generated on the substrate S. In another example embodiment, an electrode may be disposed on the upper wall 606 of the chamber 600, so that RF power may be applied between the electrode and the shower head 640. In this case, direct plasma may be generated between the shower head 640 and the upper wall 606. Alternatively, remote plasma may be generated at an outside of the chamber 600, and may be provided into the chamber 600.

Various remnants after reactions on the substrate S may be discharged through the baffle 660 and the outlet 670 connected to the lower wall 602.

Referring to FIGS. 9, 13 and 14, in step S10, the substrate 100 having the first insulating interlayer 110 and the lower wirings 230 thereon may be loaded onto the susceptor 620 in the chamber 600, and an upper surface of the first insulating interlayer 110 may be treated.

In example embodiments, due to the surface treatment, a silicon-containing precursor may be selectively adsorbed onto the upper surface of the first insulating interlayer 110 and not be adsorbed onto upper surfaces of the lower wirings 230. The surface treatment may include thermal treatment or oxidation treatment on the upper surfaces of the lower wirings 230. The thermal treatment may be performed by heating the susceptor 620 via the heater 610.

In step S20, the silicon-containing precursor may be provided into the chamber 600 via the inlet 650, and may be provided onto an upper surface of the substrate 100 through the shower head 640.

The silicon-containing precursor may include, e.g., methyldiethoxysilane (MDEOS), alpha-terpinine (ATRP), black diamond I, etc., and may be selectively adsorbed on the upper surface of the first insulating interlayer 110 to form a first layer.

In step S30, a purge gas including an inert gas, e.g., argon, helium, etc., may be provided onto the substrate 100, and may remove materials not adsorbed on the upper surface of the first insulating interlayer 110.

In step S40, an oxidizer may be provided onto the upper surface of the substrate 100, and may react with the first layer adsorbed on the upper surface of the first insulating interlayer 110 to form a second layer. In example embodiments, the second layer may be SiOCH, and thus may be the same as a material of the first insulating interlayer 110. However, the inventive concepts are not limited thereto.

The oxidizer may include, e.g., oxygen plasma, ozone, etc.

In step S50, a purge gas may be provided onto the substrate 100 to remove unreacted materials.

The second layer formed by performing the steps S20 to S50 may have a very thin thickness, and thus the steps S20 to S50 may be repeatedly performed until the second layer may have a desired thickness.

In step S60, a reducer may be provided onto the upper surface of the substrate 100, and thus a metal oxide layer formed by previous steps on the upper surfaces of the lower wirings 230 may be removed.

The reducer may include, e.g., ammonia plasma, hydrogen plasma, etc.

In step S70, a purge gas may be provided onto the substrate 100 to remove unreacted materials.

In certain embodiments, the steps S20 to S70 may be repeatedly performed. For example, the steps S20 through S70 may be repeated until the second insulating interlayer 240 has an enough thickness, e.g., more than one third of a thickness of the lower wirings 230, as shown in FIG. 9.

As described above, the second insulating interlayer 240 including, e.g., SiOCH may be formed on the upper surface of the first insulating interlayer 110 on which no lower wirings are formed.

Figure 10:
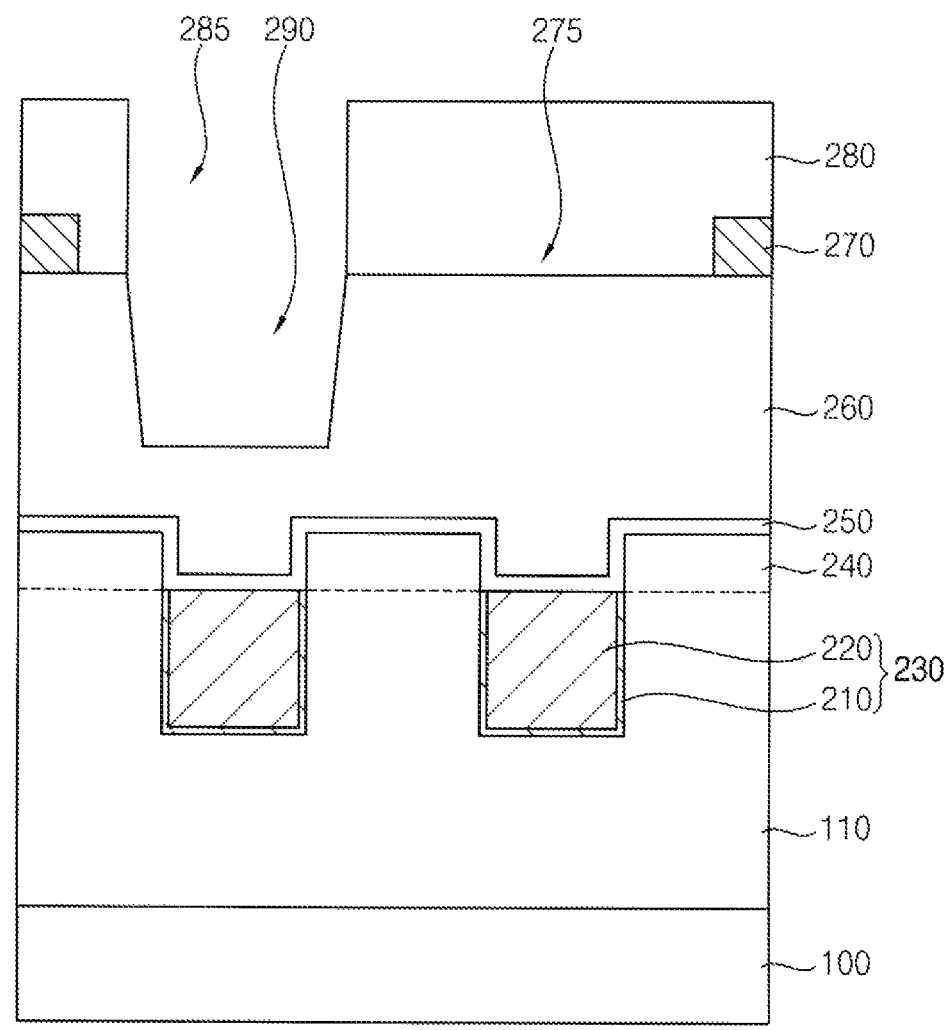

Referring to FIG. 10, a first etch stop layer 250 and a third insulating interlayer 260 may be sequentially formed on the lower wirings 230 and the second insulating interlayer 240, and first and second masks 270 and 280 may be sequentially formed on the third insulating interlayer 260.

In example embodiments, the first etch stop layer 250 may be conformally formed on upper surfaces of the lower wirings 230, sidewalls of the second insulating interlayer 240, and an upper surface of the second insulating interlayer 240. An upper surface of the third insulating interlayer 260 may be sufficiently higher than the upper surface of the second insulating interlayer 240. For example, the third insulating interlayer 260 may be thicker than the second insulating interlayer 240. The first etch stop layer 250 may include, e.g., silicon carbonitride or silicon nitride, and the third insulating interlayer 260 may include a low-k dielectric material. In an example embodiment, the third insulating interlayer 260 may include a material substantially the same as that of the first insulating interlayer 110 and/or the second insulating interlayer 240.

The first and second masks 270 and 280 may include first and second openings 275 and 285, respectively, and may partially overlap each other. For example, after the third insulating interlayer 260 is formed on the first etch stop layer 250, the first mask pattern 270 may be formed on the third insulating layer 260 by a photolithography process, and the second mask pattern 280 may be formed on the third insulating layer and on the first mask pattern 270 by another photolithography process.

The first mask 270 may include a metal nitride, e.g., titanium nitride, tantalum nitride, etc., and the second mask 280 may include an insulating material, e.g., silicon carbonitride, silicon nitride, etc.

The third insulating interlayer 260 may be etched using the first and second masks 270 and 280 as an etching mask, and thus a preliminary first via hole 290 may be formed. In example embodiments, the etching process may be performed on only a partially thickness of the third insulating interlayer 260, and thus the preliminary first via hole 290 may extend through an upper portion of the third insulating interlayer 260 but not fully through the third insulating layer 260.

In example embodiments, the preliminary first via hole 290 may be formed in an area in which the first and second openings 275 and 285 overlap each other vertically, i.e., in the third direction, and may vertically overlap one or more first wirings of the lower wirings 230 and a portion of the second insulating interlayer 240 adjacent thereto. For example, the preliminary first via hole 290 may be wider than the first wiring of the lower wirings 230 which overlaps in the second direction. The preliminary first via hole 290 may overlap the second insulating interlayer 240 adjacent to the first wiring of the lower wirings 230 that overlaps in a vertical cross-section perpendicular to the first direction. In certain embodiments, the first wirings of the lower wirings 230 may be separated conductor patterns from each other. In some embodiments, one first wiring of the lower wirings 230 may be a conductor pattern electrically connected to another conductor pattern.

Figure 11:
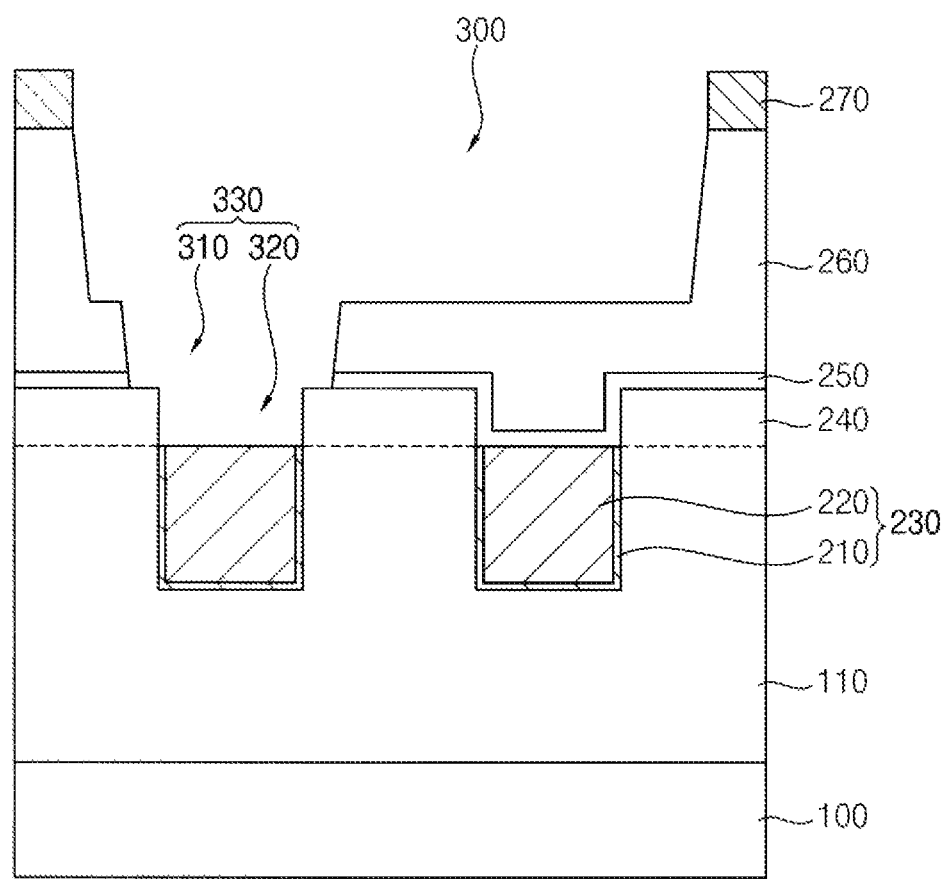

Referring to FIG. 11, after removing the second mask 280, the third insulating interlayer 260 and the first etch stop layer 250 may be etched using the first mask 270 as an etching mask, and thus a first trench 300 may be formed and a first via hole structure 330 may be formed to be connected to the first trench 300. The first via hole structure 330 may include a first via hole 310 and a second via hole 320 thereunder.

In example embodiments, the etching process may be performed until a portion of the first etch stop layer 250 on the first wiring of the lower wirings 230 and on the portion of the second insulating interlayer 240 adjacent thereto may be exposed, and may be further performed on the exposed portion of the first etch stop layer 250, such that the first wiring and the portion of the second insulating interlayer 240 adjacent thereto may be exposed. For example, first wirings may be conductor patterns exposed through respective via hole structures 330. For example, the first wirings may be conductor patterns being electrically connected with upper layer wirings through the respective via hole structures 330, as will be described below. The first etch stop layer 250 may have etching selectivity with respect to the second and third insulating interlayers 240 and 260. For example, the first etch stop layer 250 may not be substantially etched while the third insulating interlayer 260 is etched so that the first etch stop layer 250 may protect the second insulating interlayer 240 and the lower wirings 230 (e.g., the first wiring or the conductor pattern) thereunder. Similarly, the second insulating interlayer 240 may not be substantially etched while the first etch stop layer 250 is etched to expose the second insulating interlayer 240 and the lower wirings 230 (e.g., the first wiring or the conductor pattern) thereunder.

For example, the first trench 300 may extend through an upper portion of the third insulating interlayer 260, the first via hole 310 may extend through a lower portion of the third insulating interlayer 260 and a portion of the first etch stop layer 250 on the second insulating interlayer 240 to be connected to the first trench 300, and the second via hole 320 may be formed through the second insulating interlayer 240. For example, the first via hole 310 may extend through a lower portion of the third insulating interlayer 260 and a portion of the first etch stop layer 250 to be connected to the second via hole 320. For example, the lower wirings 230 may be exposed through the first trench 300 and the first via hole structure 330. For example, the first via hole 310 may connect the second via hole 320 and the first trench 300. For example, sidewalls of the first etch stop layer 250 and the third insulating interlayer 260 in the first via hole 310 form a linear shape in a cross-sectional view from a position of a plane perpendicular to the first direction as shown in FIG. 11.

In example embodiments, the second via hole 320 may have a width smaller than that of the overlying first via hole 310. For example, sidewalls of the first and second via holes 310 and 320 may form a step structure at a boundary between the first and second via holes 310 and 320 in a cross-sectional view from a position of a plane perpendicular to the first direction as shown in FIG. 11. For example, the first via hole structure 330 may have a step structure at a boundary between the first and second via holes 310 and 320. In an example embodiment, the second via hole 320 may have a width equal to that of an upper surface of the first wiring of the lower wirings 230.

In example embodiments, the second via hole 320 may be surrounded and defined by the second insulating interlayer 240, and thus may be formed at the same level with the second insulating interlayer 240. For example, the first via hole structure 330 may not extend through a portion of the second insulating interlayer 240 adjacent to the first wiring by the first etch stop layer 250 on the second insulating interlayer 240. For example, the second insulating interlayer 240 adjacent the first wiring may be protected by the etch stop layer 250 from being etched or damaged while the first trench 300 and the first via hole 310 are formed by etching the third insulating interlayer 260 and the etch stop layer 250.

FIG. 11 shows one via hole structure 330 is connected to the first trench 300, however, the inventive concepts are not limited thereto. For example, when a plurality of first wirings is formed, a plurality of first via hole structures 330 may be connected to the first trench 300.

Referring to FIG. 12A, a second barrier layer may be formed on the upper surface of the first wiring exposed by the first via hole structure 330, a sidewall of the first via hole structure 330, a portion of a bottom and a sidewall of the first trench 300, and an upper surface of the first mask 270. A second conductive layer may be formed on the second barrier layer to fill the first via hole structure 330, and the second conductive layer and the second barrier layer may be planarized until the upper surface of the third insulating interlayer 260 may be exposed. The first mask 270 may be also removed, e.g., by this planarizing process.

Thus, a second barrier pattern 340 may be formed on the upper surface of the first wiring and the sidewall of the first via hole structure 330, and a second conductive pattern 350 may be formed on the second barrier pattern 340 to fill a remaining portion of the first via hole structure 330. The second barrier pattern 340 and the second conductive pattern 350 may form a first via 360.

In certain embodiments, a third barrier pattern 370 may be formed on the portion of the bottom and the sidewall of the first trench 300, and a third conductive pattern 380 may be formed on the third barrier pattern 370 to fill a remaining portion of the first trench 300. The third barrier pattern 370 and the third conductive pattern 380 may form a first upper wiring 390. For example, the third barrier pattern 370 may be formed with the second barrier pattern 340 by the planarizing process, and the third conductive pattern 380 may be formed with the second conductive pattern 350 by the planarizing process.

In example embodiments, the first via 360 and the first upper wiring 390 may be integrally formed, and thus the second and third barrier patterns 340 and 370 may include substantially the same material, and the second and third conductive patterns 350 and 380 may include substantially the same material.

The second barrier layer may include a metal nitride, e.g., titanium nitride, tantalum nitride, tungsten nitride, etc., and the second conductive layer may include a metal, e.g., copper, aluminum, tungsten, etc.

In an example embodiment, the first upper wiring 390 may extend to a given length in the second direction, and a plurality of first upper wirings 390 may be spaced apart from each other by a given distance in the first direction.

In example embodiments, the first via 360 contacting the upper surface of the first wiring of the lower wirings 230 may include a lower portion having a width smaller than that of an upper portion thereof, e.g., in the second direction in a cross-sectional view from a position of a plane perpendicular to the first direction. In an example embodiment, the lower portion of the first via 360 may have a width equal to that of the upper surface of the first wiring, e.g., in the second direction in a cross-sectional view from a position of a plane perpendicular to the first direction.

In case, the width of the lower portion of the first via 360 is equal to that of the upper portion thereof, the shortest distance between the first via 360 and a neighboring one of the lower wirings 230 may be a second distance D2 that is a distance between a lower portion of the first via 360 and the neighboring one of the lower wirings 230. However, in example embodiments, the width of the lower portion of the first via 360 is less than that of the upper portion of the first via 360, and thus the shortest distance between the first via 360 and the neighboring one of the lower wirings 230 may be a first distance D1, which may be greater than the second distance D2.

As a result, due to the shape of the first via 360, electrical short margin between the first via 360 and the neighboring one of the lower wirings 230 may increase. As described above, when the photolithography process for forming the lower wirings 230 is performed by moving the first reticle 10 in a horizontal direction, a minute difference may be generated in the distances between the lowering wirings 230 due to the error or deviation of the horizontal movement. For example, above described step structure of the first via hole structure 330 may result in forming a step structure in the first via 360, and the step structure of the first via 360 may be helpful to reduce electrical shorts between the first via 360 and its neighboring lower wrings 230. In certain examples, misalignments may occur during the formation of the first via 360, and electrical shorts may occur between the first via 360 and the neighboring one of the lower wirings 230. Above described embodiment may be helpful to reduce these electrical short as disclosed below with respect to FIG. 12B.

Referring to FIG. 12B, the first via 360 may not be exactly formed on the upper surface of the first wiring but may be formed to be close to the neighboring one of the lower wirings 230, due to the misalignment. For example, the first via 360 may shift from a center portion of the first wiring toward the neighboring one of the lower wirings 230.

However, in example embodiments, the width of the first via 360 may not be greater than that of the first wiring at a level of the upper surface of the first wiring, and may be greater than that of the first wiring at a level higher than the upper surface of the first wiring. For example, the first distance D1, which is the shortest distance between the first via 360 and the neighboring one of the lower wirings 230, may be greater than the second distance D2, which may be the shortest distance when the second insulating interlayer 240 is not formed, and thus the electrical short margin may increase.

FIGS. 15 and 16 are cross-sectional views illustrating stages of a method of manufacturing a semiconductor device in accordance with example embodiments.

Referring to FIG. 15, the second insulating interlayer 240 may be formed only at an area adjacent the first wiring of the lower wirings 230 contacting the first via 360, which may be different from the second insulating interlayer 240 illustrated in FIG. 12A. For example, the second insulating interlayer 240 may not be formed in the vicinity of the lower wirings 230 which do not contact the first via 360.

In the semiconductor device illustrated in FIG. 12A, the second insulating interlayer 240 may be grown on an entire upper surface of the portion of the first insulating interlayer 110 at which the lower wirings 230 are not formed, however, in the semiconductor device of FIG. 15, the second insulating interlayer 240 may be grown only on an upper surface of a portion of the first insulating interlayer 110 adjacent to the first wiring. For example, the second insulating interlayer 240 may not be formed on an upper surface of the first insulating interlayer 110 other than portions adjacent to the first vias 360 connecting the lower wirings 230 and an upper wiring 390. For example, the second insulating interlayer 240 may be grown only on the upper surface of the portion of the first insulating interlayer 110 adjacent to the first wiring by forming a mask covering other portions of the first insulating interlayer 110 except for the portion adjacent to the first wiring when the selective growth process described with reference to FIG. 9 is performed on a first insulating interlayer 110 illustrated in FIG. 15. For example, the selective growth process of the embodiment illustrated in FIG. 15 may be the same as the one described with reference to the embodiment illustrated in FIG. 9 except that the mask is formed on the other portions of the first insulating interlayer 110. In certain embodiments, the mask may cover the first wiring while the selective growth process is performed on the first insulating interlayer 110 adjacent to the first wiring.

In the semiconductor device illustrated in FIG. 15, the shortest distance, the first distance D1, between the first via 360 contacting the first wiring and the neighboring one of the lower wirings 230 may be greater than the second distance D2, and thus the electrical short margin may increase. For example, the semiconductor device illustrated in FIG. 15 may have a higher margin of electrical short between the first via 360 and the neighboring one of the lower wirings 230 than a semiconductor device that does not have the second insulating interlayer 240.

Referring to FIG. 16, the third recess 235 illustrated in FIG. 8 may be formed on the lower wirings 230 other than the first wiring contacting the first wiring 360.

The third recess 235 may be formed by forming a mask covering the first wiring, and performing an etching process on the lower wirings 230 while the same processes as the ones described with reference to FIG. 8 is performed for the embodiment illustrated in FIG. 16. Thus, an upper surface of the first wiring may be higher than the other ones of the lower wirings 230.

Unlike the first via 360 illustrated in FIG. 12A, the widths of the upper and lower portions of the first via 360 of FIG. 16 may not be substantially different from each other, and a sidewall of the first via 360 may not be bent in the middle. However, the shortest distance between the first via 360 and the neighboring one of the lower wirings 230 is the first distance D1, which may be greater than the second distance D2 between the first via 360 and the neighboring one of the lower wirings 230 when upper portions of the lower wirings 230 other than the first wiring are not removed. Accordingly, the electrical short margin between the first via 360 and the neighboring one of the lower wirings 230 may increase. For example, the first via 360 of FIG. 16 may have a linear cross-sectional view without a step structure as shown in FIG. 16. The exemplary embodiment illustrated in FIG. 16 may be also helpful to increase electrical short margin between the first via 360 and a neighboring lower wiring 230 because the neighboring lower wiring 230 is recessed and the distance D1 between the first via 360 and the neighboring lower wiring 230 is farther than D2 which is the same as a distance between the first via 360 and the neighboring lower wiring 230 when the neighboring lower wiring 230 is not recessed.

FIGS. 17 to 25 are perspective views illustrating stages of a method of manufacturing a semiconductor device in accordance with example embodiments. This method may include processes substantially the same as or similar to those described with reference to FIGS. 1 to 16, and thus duplicated descriptions will be omitted for brevity.

Figure 17:
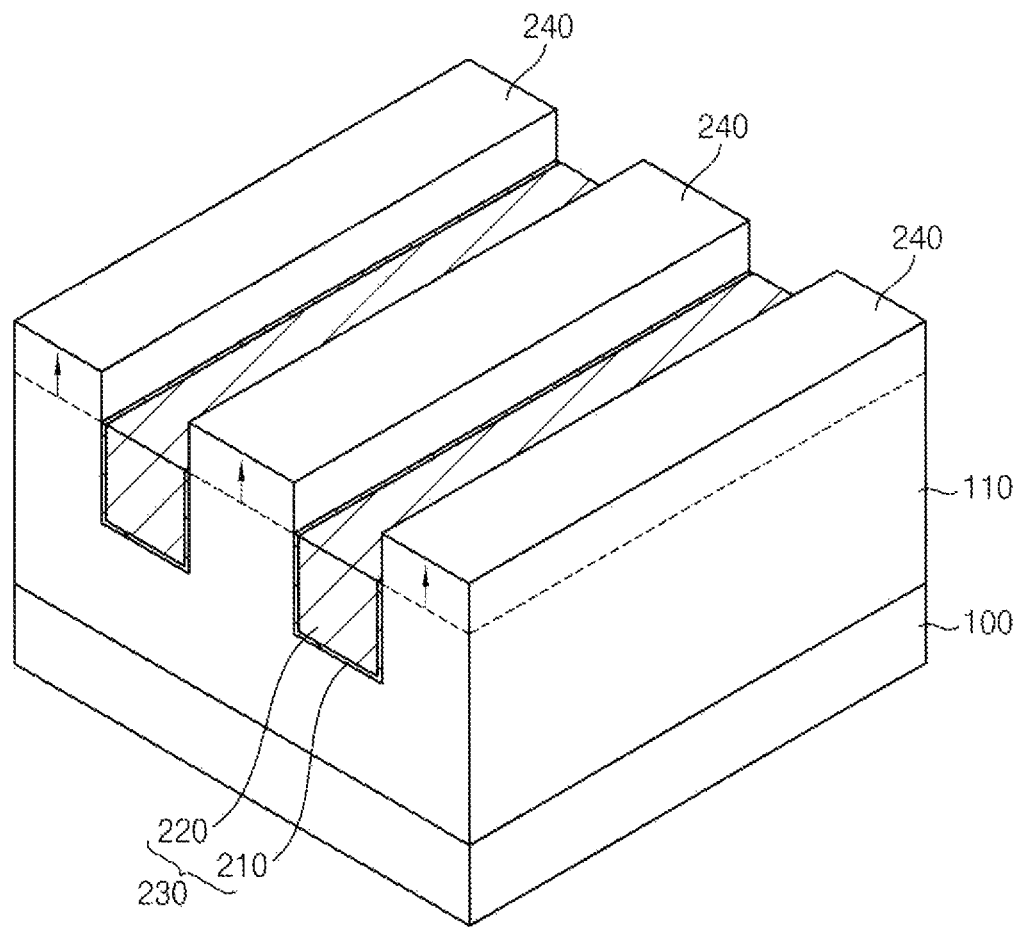

Referring to FIG. 17, processes substantially the same as or similar to those described with reference to FIGS. 1 to 7 and 9 may be performed. Thus, the second insulating interlayer 240 may be selectively formed only on the upper surface of the first insulating interlayer 110. For example, the second insulating interlayer 240 may be formed on an exposed upper surface of the first insulating interlayer 110, and may not be formed on the upper surface of the lower wirings 230.

Processes substantially the same as or similar to those described with reference to FIG. 8 may be performed in the embodiments illustrated in FIGS. 17 to 25. However, for ease of explanation, the processes substantially the same as or similar to the ones described with reference to FIG. 9 will be mainly described hereinafter for brevity.

Figure 18:
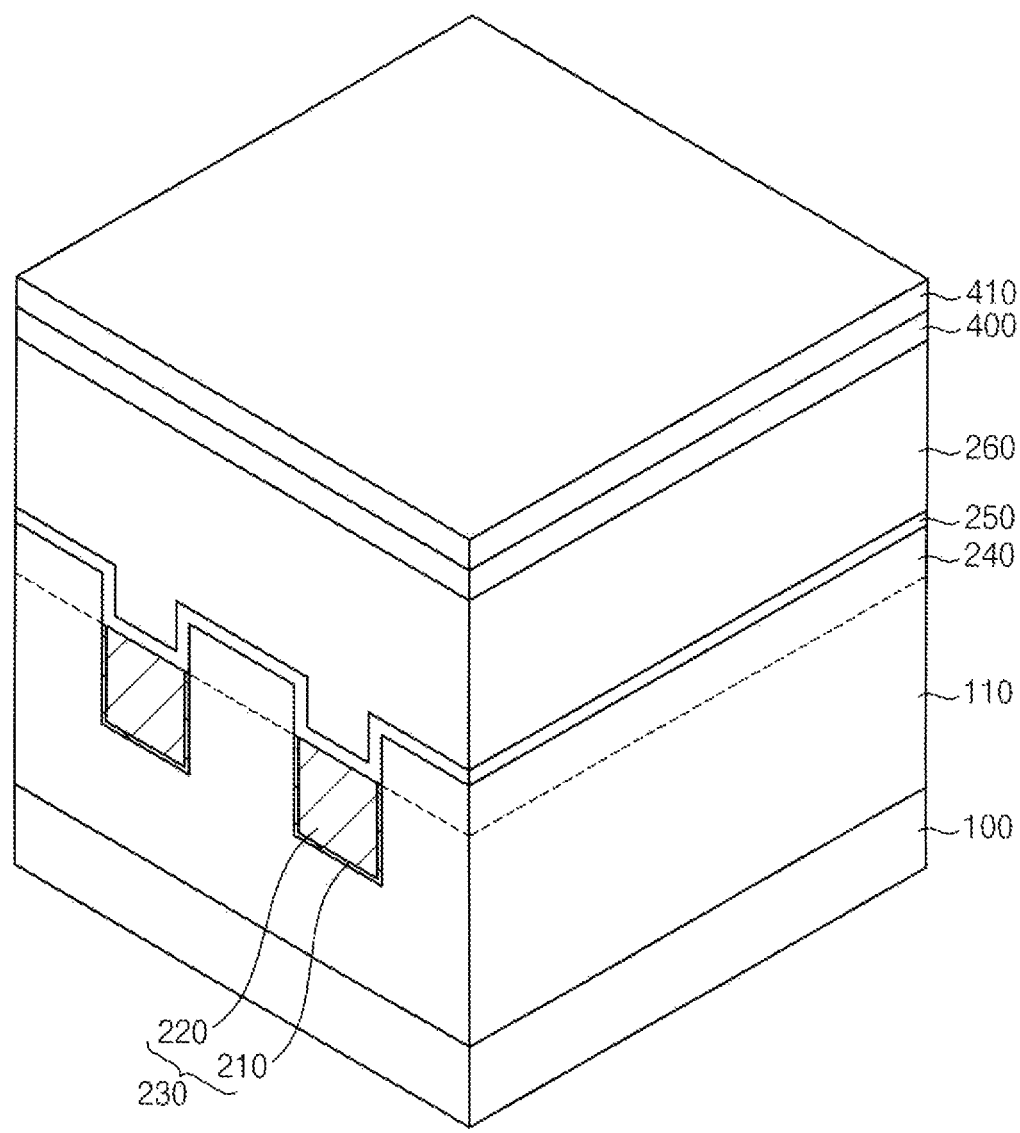

Referring to FIG. 18, processes substantially the same as or similar to those described with reference to FIG. 10 may be performed.

For example, the first etch stop layer 250 and the third insulating interlayer 260 may be sequentially formed on the lower wirings 230 and the second insulating interlayer 240 in the third direction, and a second etch stop layer 400 and a third mask layer 410 may be sequentially formed on the third insulating interlayer 260 in the third direction.

The second etch stop layer 400 may include, e.g., silicon nitride, and the third mask layer 410 may include, e.g., silicon oxynitride.

Figure 19:
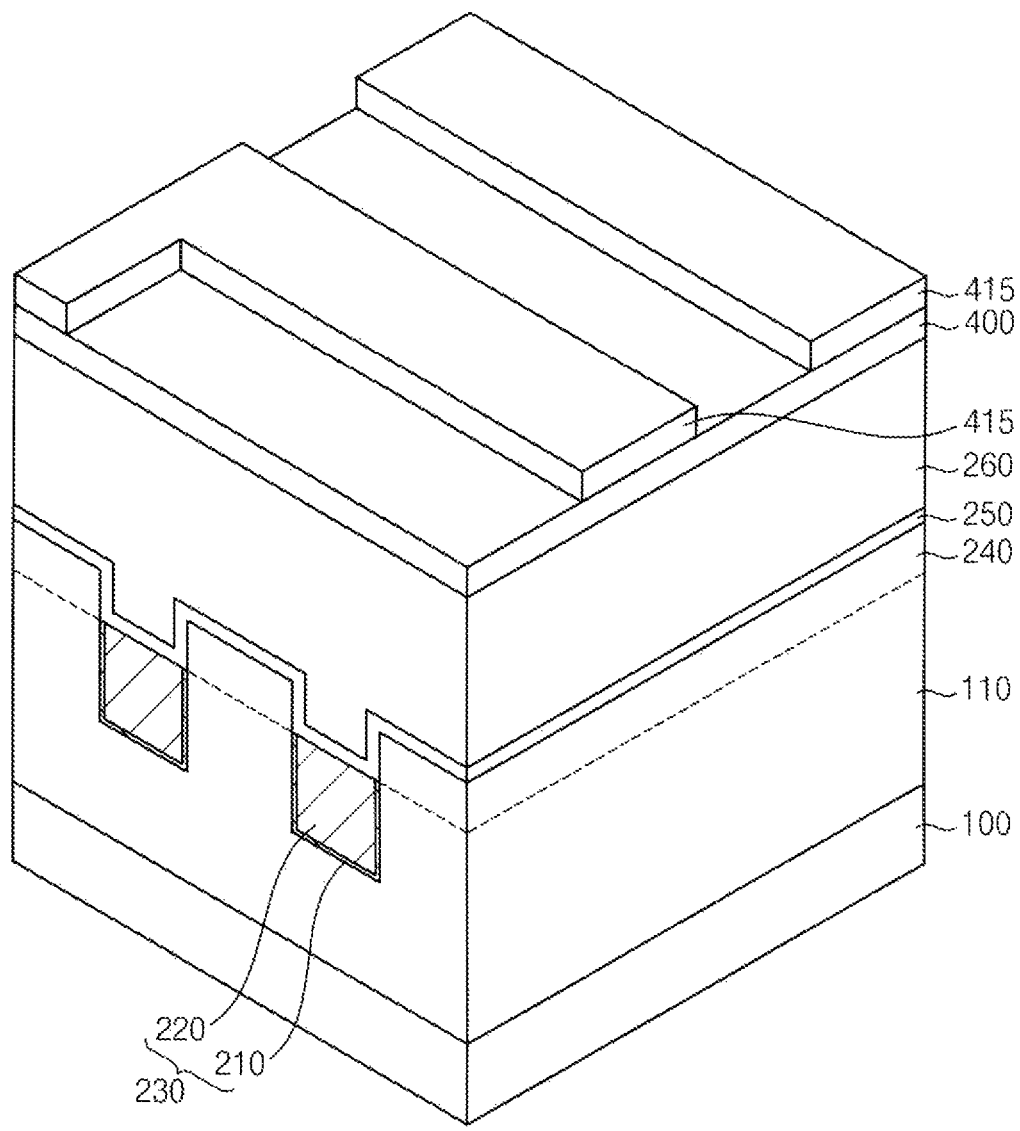

Referring to FIG. 19, the third mask layer 410 may be patterned to form a third mask 415.

In example embodiments, the third mask 415 may extend in the second direction, and a plurality of third masks 415 may be formed in the first direction. In an example embodiment, one of the plurality of third masks 415 may further include an extension portion extending in the first direction to a given length at an end thereof in the second direction. For example, the third mask 415 extending in the second direction and having the extension in the first direction may have an "L-shape" as shown in FIG. 19.

Figure 20:
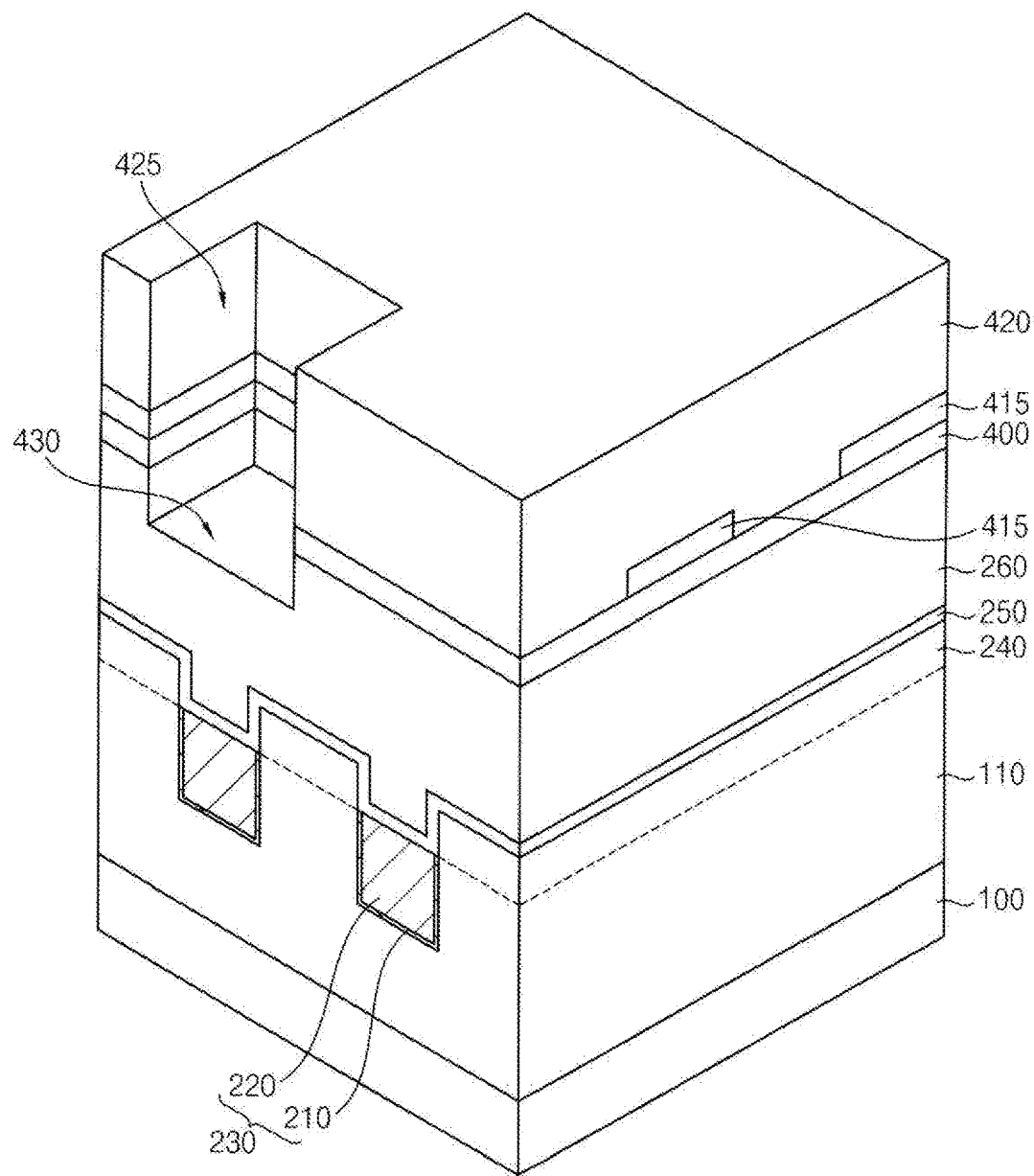

Referring to FIG. 20, a fourth mask 420 may be formed on the third mask 415 and the second etch stop layer 400.

In example embodiments, the fourth mask 420 may cover the third masks 415, and may include a third opening 425 overlapping, in the third direction, a first wiring of the lower wirings 230 and a portion of the second insulating interlayer 240 adjacent thereto.

The fourth mask 420 may include, e.g., spin-on-hardmask (SOH) or amorphous carbon layer (ACL).

The third insulating interlayer 260 may be etched using the third and fourth masks 415 and 420 as an etching mask, and thus a preliminary second via hole 430 may be formed. In example embodiments, the etching process may be performed only on a given thickness of the third insulating interlayer 260, and thus the preliminary second via hole 430 may extend through an upper portion of the third insulating interlayer 260. For example, an upper portion of the third insulating interlayer 260 may be etched by an etching process using the fourth mask 420, and a lower portion of the third insulating interlayer 260 may remain after the etching process.

In example embodiments, the preliminary second via hole 430 may overlap, in the third direction, the first wiring and the portion of the second insulating interlayer 240 adjacent thereto. For example, the preliminary second via hole 430 may be wider than the first wiring in the second direction.

Figure 21:
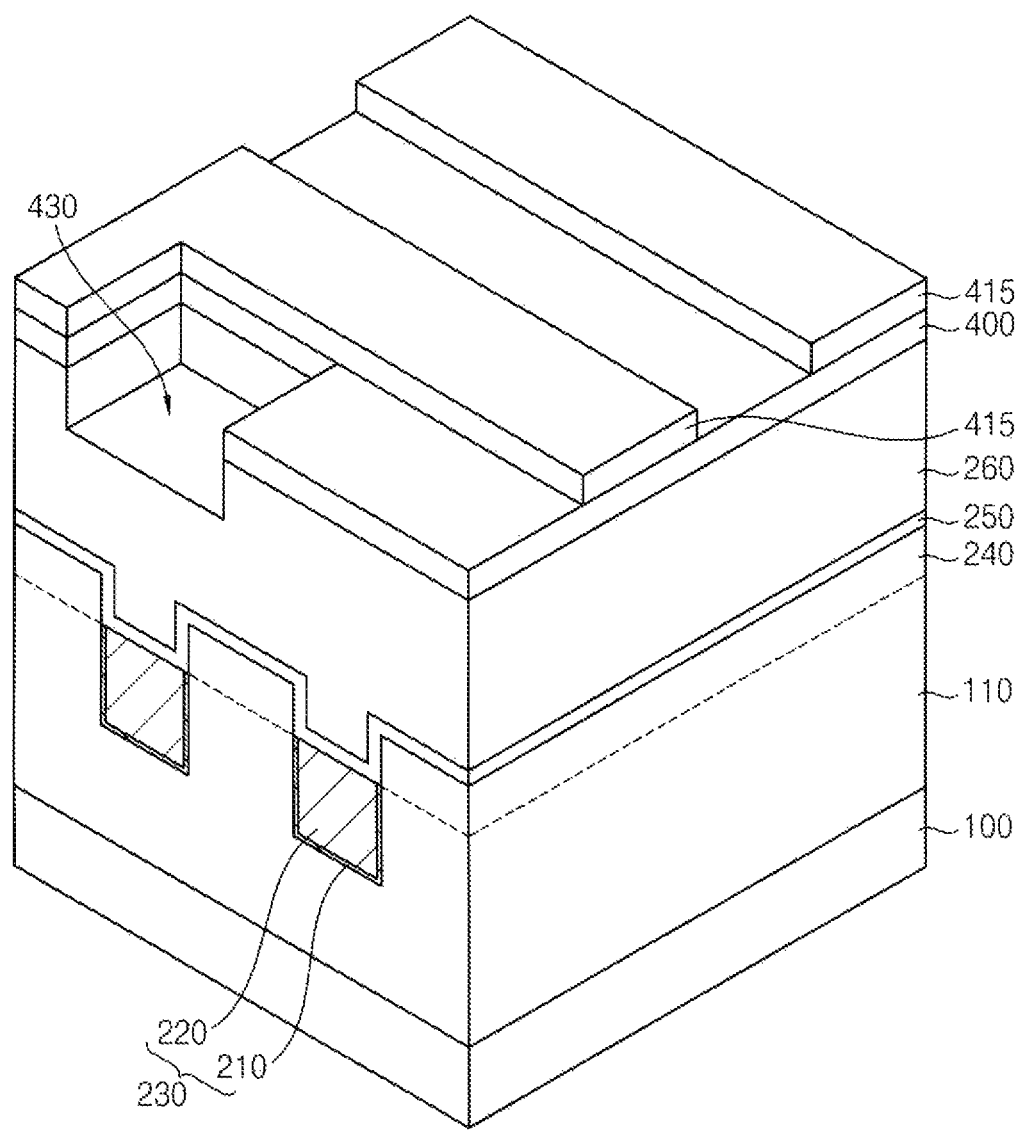

Referring to FIG. 21, the fourth mask 420 may be removed.

Thus, the underlying third mask 415 and the second etch stop layer 400 may be exposed.

Figure 22:
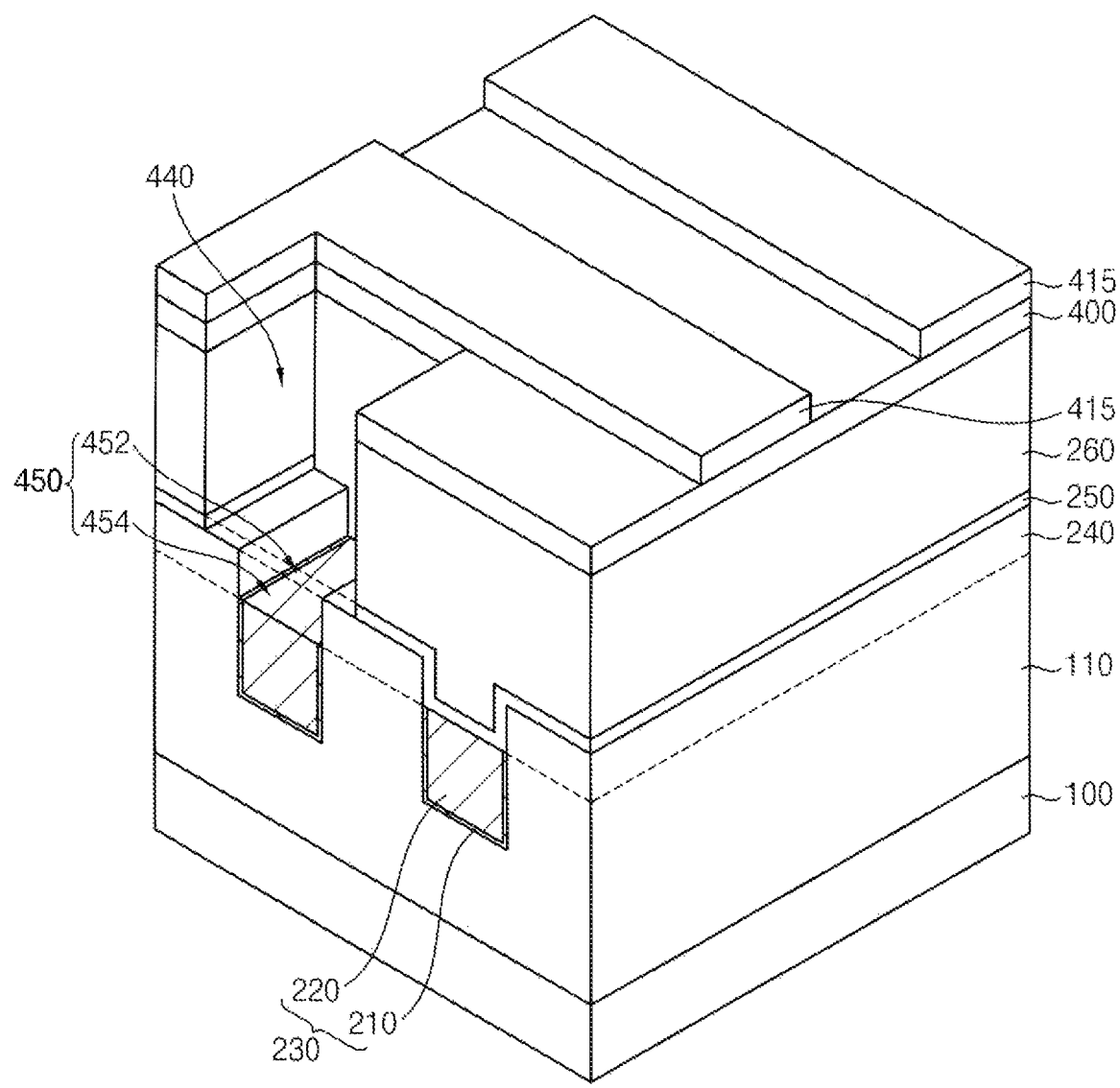

Referring to FIG. 22, the third insulating interlayer 260 and the first etch stop layer 250 may be etched using the third mask 415 and the second etch stop layer 400 as an etching mask, and thus a second trench 440 and a second via hole structure 450 connected to the second trench 400 may be formed. The second via hole structure 450 may include a third via hole 452 and a fourth via hole 454 thereunder.

In example embodiments, the etching process may be performed until portions of the first etch stop layer 250 on the first wiring and on the portion of the second insulating interlayer 240 adjacent the first wiring may be exposed, and the etching process may be further performed on the exposed portions of the first etch stop layer 250 to expose the first wiring and the portion of the second insulating interlayer 240 adjacent thereto.

As shown in FIG. 22, the second trench 440 may extend through the third insulating interlayer 260, the third via hole 452 may extend through the first etch stop layer 250 to be connected to the second trench 440, and the fourth via hole 454 may extend through the second insulating interlayer 240 to be connected to the third via hole 452. In certain embodiments, the second trench 440 may extend through an upper portion of the third insulating interlayer 260, the third via hole 452 may extend through the portion of the first etch stop layer 250 on the second insulating interlayer 240 to be connected to the second trench 440, and the fourth via hole 454 may extend through a lower portion of the third insulating interlayer 260 and the portion of the first etch stop layer 250 on the first wiring to be connected to the third via hole 452. For example, the second trench 440 and the third via hole 452 may have the same width in the second direction as shown in FIG. 22.

In example embodiments, the fourth via hole 454 may have a width smaller than that of the third via hole 452. In an example embodiment, the width of the fourth via hole 454 may be equal to that of an upper surface of the first wiring, e.g., in the second direction as shown in FIG. 22.

In example embodiments, the fourth via hole 454 may be surrounded and defined by the second insulating interlayer 240, and thus may be formed at substantially the same level as that of the second insulating interlayer 240. For example, the second via hole structure 450 may not extend through the portion of the second insulating interlayer 240 adjacent to the first wiring due to the first etch stop layer 250 on the second insulating interlayer 240. For example, the first etch stop layer 250 may protect the second insulating interlayer 240 from being etched while the second trench 440 is formed.

Figure 23:
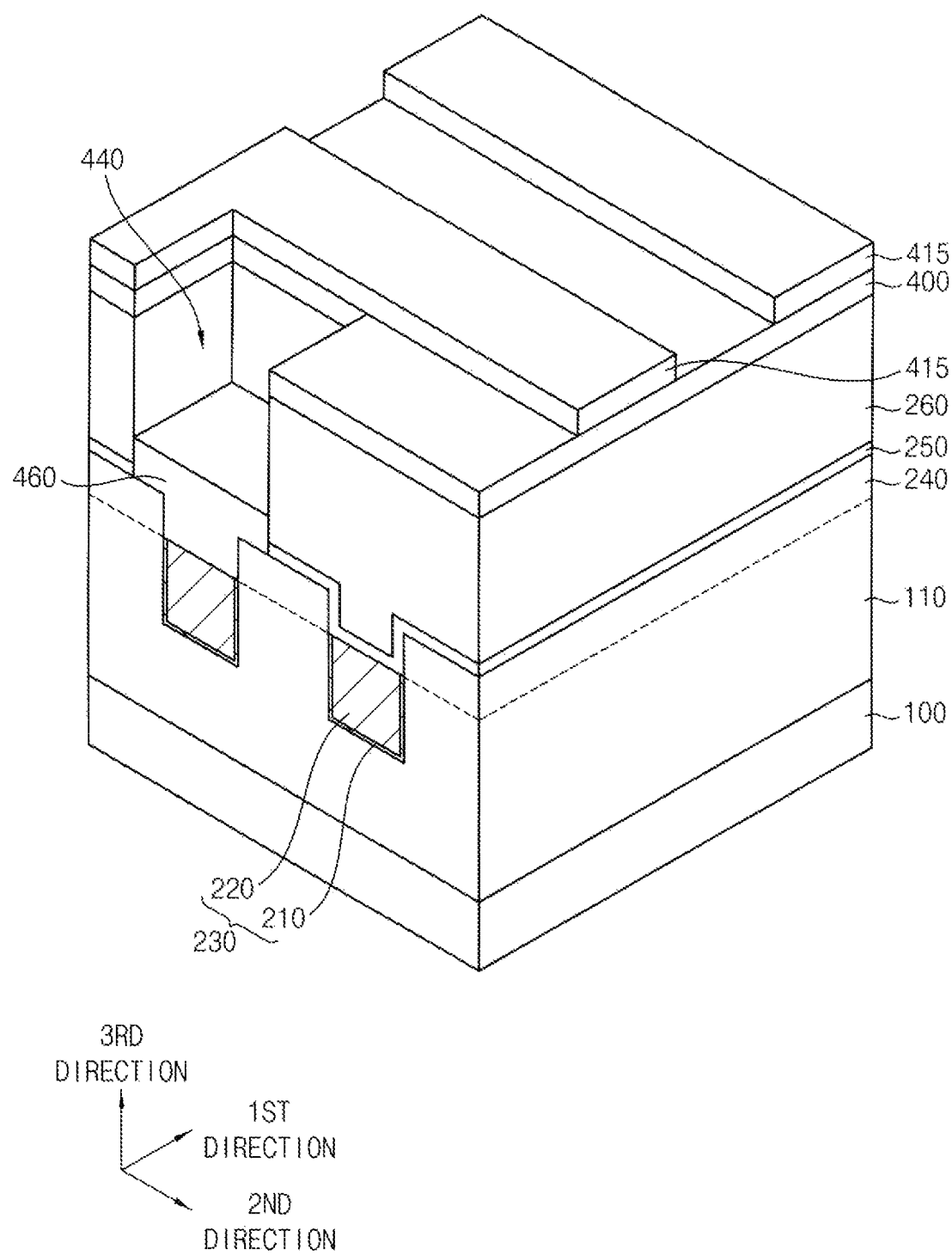

Referring to FIG. 23, a sacrificial layer 460 may be formed to fill the second via hole structure 450.

In an example embodiment, the sacrificial layer 460 may partially fill the second trench 440, however, the inventive concepts may not be limited thereto. For example, any sacrificial layers may be included in the scope of the inventive concepts when they fill the second via hole structure 450 to cover the exposed upper surface of the first wiring and the exposed portion of the second insulating interlayer 240. FIG. 23 shows the sacrificial layer 460 fill the second via hole structure 450 and a lower portion of the second trench 440.

The sacrificial layer 460 may include, e.g., SOH, ACL, etc.

Figure 24:
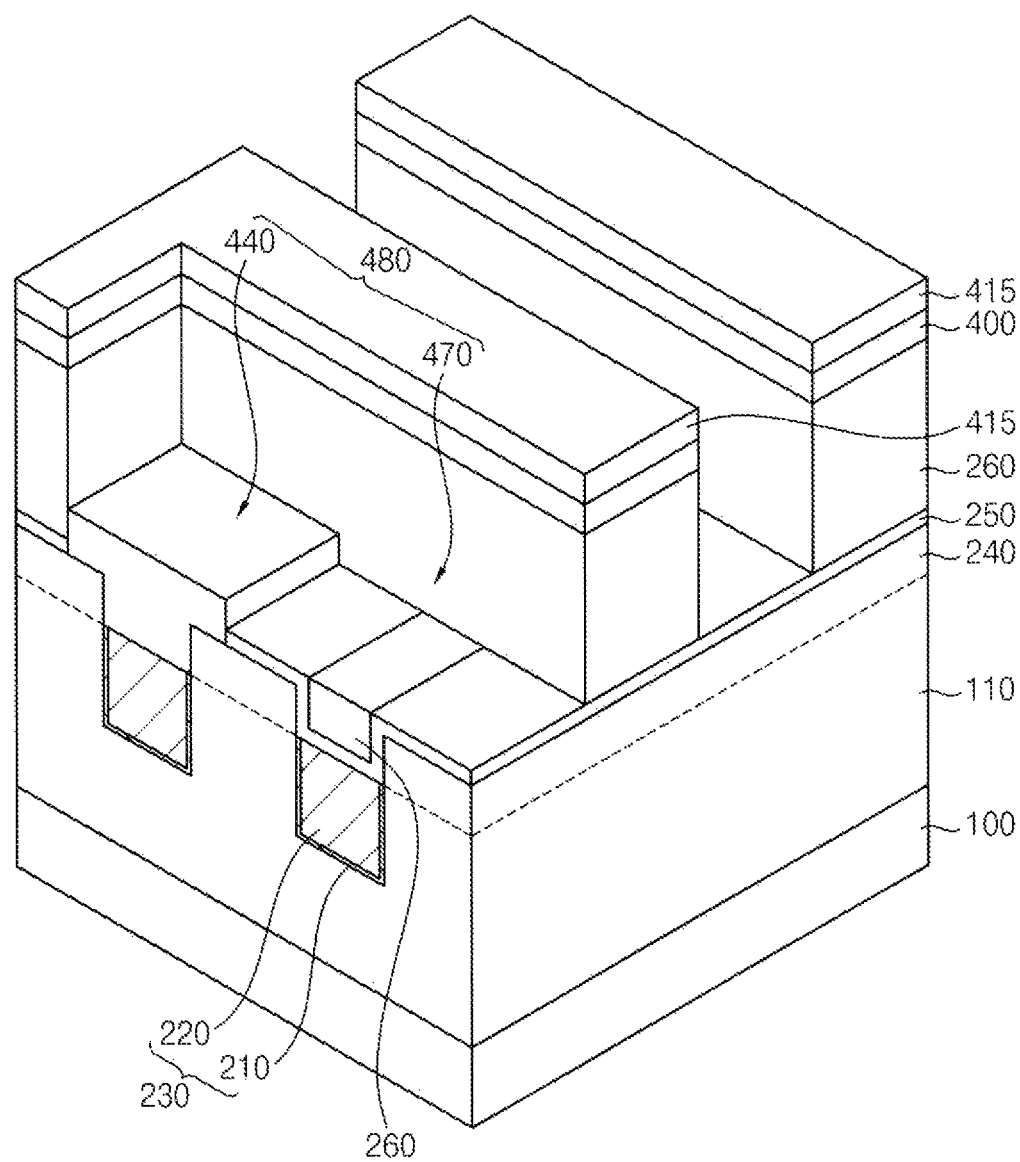

Referring to FIG. 24, the second etch stop layer 400 and the third insulating interlayer 260 may be etched using the third mask 415 and the sacrificial layer 460 as an etching mask, and thus a third trench 470 may be formed at an upper portion of the third insulating interlayer 260. For example, the third insulating interlayer 260 may remain at a bottom of the third trench 470, e.g., over the lower wirings 230 as shown in FIG. 24. The second and third trenches 440 and 470 may form a trench structure 480.

The etching process may be performed until the first etch stop layer 250 may be exposed, and thus a portion of the first etch stop layer 250 on the lower wirings 230 other than the first wiring and on the portion of the second insulating interlayer 240 adjacent to the lower wirings 230, and a portion of the third insulating interlayer 260 on the lower wirings 230 may not be removed but remain. In certain embodiments, the third insulating interlayer 260 remaining on the lower wirings 230 may have a lower top surface than the top surface of the first etch stop layer 250 formed on the second insulating interlayer 240.

Figure 25:
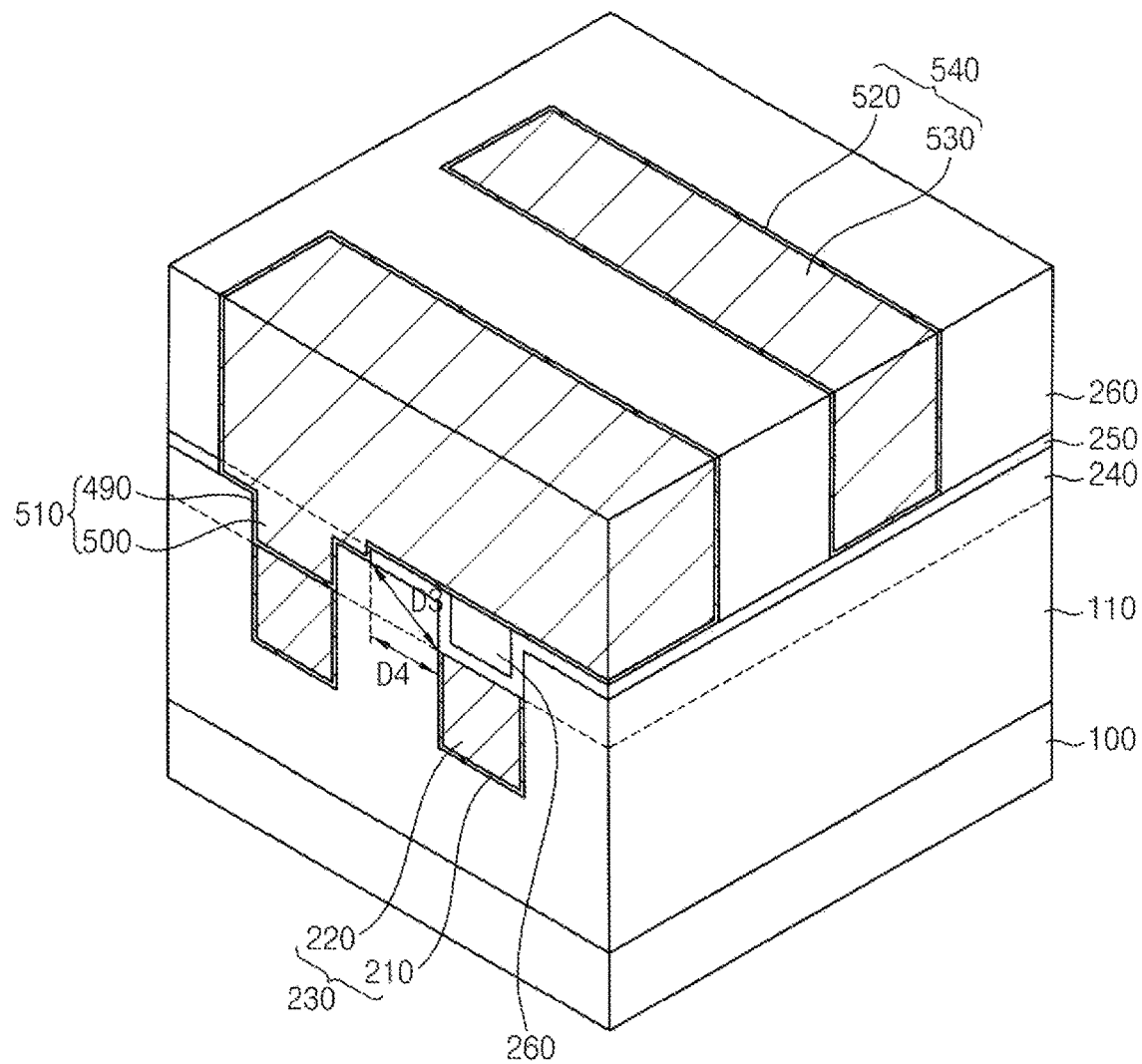

Referring to FIG. 25, the sacrificial layer 460 may be removed such that the second via hole structure 450 may be formed, exposed or open again. A third barrier layer may be formed on the exposed upper surface of the first wiring, a sidewall of the second via hole structure 450, a portion of a bottom and a sidewall of the trench structure 480, and an upper surface of the third mask 415. For example, the third barrier layer may be conformally formed on the first wiring, the sidewall of the second via hole structure 450, the portion of the side wall and the bottom of the trench structure 480, and the upper surface of the third mask 415. A third conductive layer may be formed on the third barrier layer to fill the trench structure 480 and the second via hole structure 450, and the third conductive layer and the third barrier layer may be planarized, e.g., by a CMP process, until an upper surface of the third insulating interlayer 260 may be exposed. The third mask 415 and the second etch stop layer 400 may be also removed, e.g. by a planarizing process.

For example, a fourth barrier pattern 490 may be formed on the upper surface of the first wiring and the sidewall of the second via hole structure 450, and a fourth conductive pattern 490 may be formed on the fourth barrier pattern 490 to fill a remaining portion of the second via hole structure 450. The fourth barrier pattern 490 and the fourth conductive pattern 500 may form a second via 510.

For example, a fifth barrier pattern 520 may be formed on the portion of the bottom and the sidewall of the trench structure 480, and a fifth conductive pattern 530 may be formed on the fifth barrier pattern 520 to fill a remaining portion of the trench structure 480. The fifth barrier pattern 520 and the fifth conductive pattern 530 may form a second upper wiring 540.

In example embodiments, the second via 510 and the second upper wiring 540 may be integrally formed, and thus the fourth and fifth barrier patterns 490 and 520 may include substantially the same material, and the fourth and fifth conductive patterns 500 and 530 may include substantially the same material.

In an example embodiment, the second upper wiring 540 may extend in the second direction to a given length, and a plurality of second upper wirings 540 may be formed to be spaced apart from each other in the first direction.

In example embodiments, the lower portion of the second via 510 may have a width smaller than that of the upper portion of the second via 510, e.g., in the second direction, and thus the shortest distance between the second via 510 and the neighboring one of the lower wirings 230 may be a third distance D3, which may be a distance between a bottom of an upper portion of the second via 510 and an upper surface of the neighboring one of the lower wirings 230, greater than a fourth distance D4 which is the shortest distance between the second via 510 and the neighboring lower wirings 230 when the second insulating interlayer 240 is not formed on the first insulating interlayer 110. Accordingly, the electrical short margin between the second via 510 and the neighboring one of the lower wirings 230 may increase.

A semiconductor device formed by the exemplary methods of the present disclosure may be applied to various types of memory devices and systems including wiring structures. For example, the semiconductor device may be applied to logic devices such as central processing units (CPUs), main processing units (MPUs), or application processors (APs), or the like. For example, the semiconductor device may be applied to volatile memory devices such as DRAM devices or SRAM devices, or non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   forming a first insulating interlayer on a substrate, the first insulating interlayer containing lower wirings of which upper surfaces are exposed;
   selectively forming a second insulating interlayer on an exposed upper surface of the first insulating interlayer;
   sequentially forming a first etch stop layer and a third insulating interlayer on the lower wirings and the second insulating interlayer;
   forming a trench and first and second via holes, the trench extending through an upper portion of the third insulating interlayer, the first via hole extending through a lower portion of the third insulating interlayer and a portion of the first etch stop layer to be connected to the trench, the second via hole extending through the second insulating interlayer to expose a first wiring of the lower wirings and to be connected to the first via hole, and the second via hole having a width smaller than that of the first via hole; and
   forming an upper wiring and a via, the upper wiring filling the trench, and the via filling the first and second via holes,
   wherein forming the trench and the first and second via holes includes:
      sequentially forming first and second masks on the third insulating interlayer;
      etching an upper portion of the third insulating interlayer using the first and second masks as an etching mask to form a preliminary via hole overlapping the first wiring and a portion of the second insulating interlayer adjacent to the first wiring;
      after removing the second mask, etching the third insulating interlayer using the first mask as an etching mask to expose a portion of the first etch stop layer on the first wiring and on the portion of the second insulating interlayer adjacent to the first wiring; and
      removing the exposed portion of the first etch stop layer to expose an upper surface of the first wiring and the portion of the second insulating interlayer adjacent to the first wiring.

2. The method of claim 1, selectively forming the second insulating interlayer on the exposed upper surface of the first insulating interlayer includes performing an atomic layer deposition (ALD) process such that the second insulating interlayer is selectively grown on the exposed upper surface of the first insulating interlayer, the ALD process including:
   i) providing a silicon-containing precursor;
   ii) providing a first purge gas after providing the silicon-containing precursor;
   iii) providing an oxidizer after providing the first purge gas;
   iv) providing a second purge gas after providing the oxidizer;
   v) providing a reducer after providing the second purge gas; and
   vi) providing a third purge gas after providing the reducer.

3. The method of claim 2, wherein steps i) to iv) are repeatedly performed.

4. The method of claim 1, wherein the first to third insulating interlayers include a low-k dielectric material, and the first etch stop layer includes silicon carbonitride or silicon nitride.

5. The method of claim 1, wherein forming the trench and the first and second via holes includes:
   sequentially forming a second etch stop layer and the first and second masks on the third insulating interlayer;
   etching the second etch stop layer and an upper portion of the third insulating interlayer using the first and second masks as an etching mask to form a preliminary via hole overlapping the first wiring and a portion of the second insulating interlayer adjacent to the first wiring;

forming a sacrificial layer on the exposed upper surface of the first wiring and the exposed portion of the second insulating interlayer;

etching the second etch stop layer and the third insulating interlayer using the sacrificial layer and the first mask as an etching mask to expose a portion of the first etch stop layer; and removing the sacrificial layer.

6. The method of claim 1, wherein the second via hole is formed at the same level as that of the second insulating interlayer, and the width of the second via hole is equal to that of the first wiring.

7. The method of claim 1, wherein the selectively forming of the second insulating interlayer on the exposed upper surface of the first insulating interlayer comprises forming the second insulating interlayer on the first insulating interlayer while without forming a layer on the lower wirings of which surfaces are exposed.

8. The method of claim 1, wherein the second via hole exposes a portion of an upper surface of the first wiring.

9. The method of claim 1, wherein selectively forming the second insulating interlayer on the exposed upper surface of the first insulating interlayer includes forming the second insulating interlayer on an upper surface of a portion of the first insulating interlayer adjacent to the first wiring of the lower wirings, and wherein the second insulating interlayer is not formed on upper surfaces of portions of the first insulating interlayer adjacent to other lower wirings.

10. A method of manufacturing a semiconductor device, the method comprising:

forming a first insulating interlayer on a substrate, the first insulating interlayer containing lower wirings of which upper surfaces of the lower wirings are exposed and at a height lower than upper surfaces of the first insulating interlayer;

sequentially forming a first etch stop layer and a second insulating interlayer on the lower wirings and the first insulating interlayer;

forming a trench and first and second via holes, the trench extending through an upper portion of the second insulating interlayer, the first via hole extending through a lower portion of the second insulating interlayer and a portion of the first etch stop layer to be connected to the trench, and the second via hole extending through an upper portion of the first insulating interlayer to expose a first wiring of the lower wirings and to be connected to the first via hole; and forming an upper wiring and a via, the upper wiring filling the trench, and the via filling the first and second via holes, wherein forming the trench and the first and second via holes includes:

sequentially forming first and second masks on the second insulating interlayer;

etching an upper portion of the second insulating interlayer using the first and second masks as an etching mask to form a preliminary via hole overlapping the first wiring and a portion of the first insulating interlayer adjacent to the first wiring;

after removing the second mask, etching the second insulating interlayer using the first mask as an etching mask to expose a portion of the first etch stop layer on the first wiring and on the portion of the first insulating interlayer adjacent to the first wiring; and removing the exposed portion of the first etch stop layer to expose an upper surface of the first wiring and the portion of the first insulating interlayer adjacent to the first wiring.

11. The method of claim 10, wherein forming the trench and the first and second via holes includes:

sequentially forming a second etch stop layer and first and second masks on the second insulating interlayer;

etching the second etch stop layer and an upper portion of the second insulating interlayer using the first and second masks as an etching mask to form a preliminary via hole overlapping the first wiring and a portion of the first insulating interlayer adjacent to the first wiring;

forming a sacrificial layer on the exposed upper surface of the first wiring and on the exposed portion of the first insulating interlayer;

etching the second etch stop layer and the second insulating interlayer using the sacrificial layer and the first mask as an etching mask to expose a portion of the first etch stop layer; and removing the sacrificial layer.

12. A method of manufacturing a semiconductor device, the method comprising:

forming a first insulating layer on a substrate;

forming a first conductor pattern and a second conductor pattern in the first insulating layer, a top surface of the first insulating layer protruding above a top surface of the first and second conductor patterns, the first and second conductor patterns extending to a first direction;

sequentially forming a first etch stop layer and a second insulating layer on the first insulating layer and on the first and second conductor patterns;

forming a third conductor pattern on the second insulating layer, the third conductor pattern extending to a second direction crossing the first direction; and forming a first via electrically connecting the first conductor pattern and the third conductor pattern, the first via contacting the first conductor pattern and a portion of the top surface of the first insulating layer adjacent to the first conductor pattern, wherein a boundary between the first via and the first conductor pattern is lower than a boundary between the first via and the portion of the top surface of the first insulating layer, wherein forming the third conductor pattern and the first via includes forming a trench and a via hole in the second insulating layer, the forming the trench and the via hole including:

sequentially forming first and second masks on the second insulating layer;

etching an upper portion of the second insulating layer using the first and second masks as an etching mask to form a preliminary via hole overlapping the first conductor pattern and a portion of the first insulating layer adjacent to the first conductor pattern;

after removing the second mask, etching the second insulating layer using the first mask as an etching mask to expose a portion of the first etch stop layer on the first conductor pattern and on the portion of the first insulating layer adjacent to the first conductor pattern; and removing the exposed portion of the first etch stop layer to expose an upper surface of the first conductor pattern and the portion of the first insulating layer adjacent to the first conductor pattern.

13. The method of claim 12, wherein the forming the first and second conductor patterns comprising:

forming recesses on the first insulating layer;
depositing a first conductive layer on the first insulating layer;
planarizing the first conductive layer and the first insulating layer for the first insulating layer to be exposed; and
after the planarizing the first conductive layer and the first insulating layer, etching the first conductive layer to form the first and second conductor patterns and to have top surfaces of the first and second patterns lower than a top surface of the first insulating layer.

14. The method of claim 12, wherein the forming the first insulating layer comprising:
depositing a first sub-insulating layer of the first insulating layer on the substrate; and
after the forming the first and second conductor patterns, growing a second sub-insulating layer of the first insulating layer on an exposed portion of the first sub-insulating layer.

15. The method of claim 12, wherein the third conductor pattern and the first via are formed integrally, and wherein the first and second conductor patterns are formed separately from the third conductor pattern and the first via.

16. The method of claim 12,
wherein the first etch stop layer having an etching selectivity with respect to the second insulating layer, and
wherein the via hole is formed through the first etch stop layer to expose an upper surface of the first conductor pattern.

17. The method of claim 12, wherein the second conductor pattern and the third conductor pattern are insulated from each other in a cross-sectional view from a position of a plane perpendicular to the first direction and crossing the first via.

\* \* \* \* \*